United States Patent [19]
Carley

[11] Patent Number: 5,793,709
[45] Date of Patent: Aug. 11, 1998

[54] FREE LOOP INTERVAL TIMER AND MODULATOR

[75] Inventor: Adam L. Carley, Windham, N.H.

[73] Assignee: XLI Corporation, North Billerica, Mass.

[21] Appl. No.: 635,306

[22] Filed: Apr. 19, 1996

[51] Int. Cl.$^6$ .............. G04F 8/00; H03B 21/00; H03H 11/26; G06F 1/04
[52] U.S. Cl. .............. 368/113; 368/120; 327/105; 327/261; 327/276; 327/291; 332/112; 332/118
[58] Field of Search .............. 368/113–120; 364/569; 377/20, 33, 34, 56; 341/142, 152, 155–159, 166–170; 332/103–106, 109–114; 327/31, 100, 105, 113, 161, 291, 299, 261, 276

[56] References Cited

U.S. PATENT DOCUMENTS

| | | | |
|---|---|---|---|
| 4,595,992 | 6/1986 | Drogin | 364/569 |
| 4,677,648 | 6/1987 | Zurfluh | 375/120 |
| 4,998,109 | 3/1991 | Lechevalier | 341/166 |
| 5,166,959 | 11/1992 | Chu et al. | 377/20 |
| 5,204,678 | 4/1993 | Foley | 341/152 |
| 5,537,069 | 7/1996 | Volk | 327/149 |
| 5,552,733 | 9/1996 | Lesmeister | 327/295 |

*Primary Examiner*—Vit W. Miska
*Attorney, Agent, or Firm*—Iandiorio & Teska

[57] ABSTRACT

A free loop oscillator system including a set of successive delay elements connected in series forming a free-running loop oscillator, a set of taps disposed between the delay elements, a circuit for determining the speed of the free-running loop oscillator, and circuit for choosing a given tap in response to the speed of the free-running loop oscillator. Such a system may be implemented as a part of interval timer, a printer controller, a frequency synthesizer, an FM modulator, a digital-to-analog converter, or any other device which requires the availability of finely addressable signals since the taps disposed between the delay elements present signals much finer than any presently available clock.

16 Claims, 21 Drawing Sheets

FREE LOOP INTERVAL TIMER AND MODULATOR

FIELD OF INVENTION

This invention relates to an interval timer for very precisely determining time intervals and also a modulator for very precisely and very quickly producing signal transitions between or on the clock pulses of a reference clock.

BACKGROUND OF INVENTION

There are many instances where it would be desirable to inexpensively divide units of time or units of distance into smaller units. For example, in a range detector, the time elapsed between the outgoing signal and the incoming signal may be very short, on the order of nanoseconds, and the use of a standard reference clock to count the time elapsed would yield an inaccurate count resulting in inaccurate distance calculations.

In another example, in laser printers, it is often desirable to provide a transition from white to black (or vice versa) at various distances within a given line cell for high resolution. See U.S. Pat. No. 5,109,283 incorporated herein by this reference. A white-to-black or black-to-white signal, however, clocked at the printer's pixel clock rate of 10 MHz, is not resolved finely enough at the printer's laser diode to accurately phase transitions within a given cell (print pixel). Faster clocks are too expensive and/or not available to reference the black-to-white or white-to-black transitions at the resolution of one nanosecond corresponding to print cell distances on the order of microns required for high resolution graphic images.

SUMMARY OF INVENTION

It is therefore an object of this invention to provide a device incorporating a free-running loop oscillator which, when implemented in one environment, results in an interval timer having a very high accuracy; and which, when implemented in another environment, results in a modulator useful in printer engines and other devices.

It is a further object of this invention to provide such an interval timer and/or free running loop modulator which operates to provide time addressable signals addressable every nanosecond or even every fraction of a nanosecond even though the system clock period is many nanoseconds and therefor lacks this capacity.

It is a further object of this invention to provide an interval timer which very precisely measures the time elapsed between an event start time and an event end time providing nanosecond or sub-nanosecond accuracy.

It is a further object of this invention to provide a modulator which operates over a wide range of reference clock rates.

It is a further object of this invention to provide such a modulator which has the capacity to drive a printer's laser diode to cause black-to-white and/or white-to-black transitions within a print cell.

It is a further object of this invention to provide a uniquely designed free loop oscillator circuit which may be implemented within frequency synthesizers, frequency modulators, and digital-to-analog converters.

It is a further object of this invention to implement such a modulator entirely within an all-digital integrated circuit and to utilize a minimum of silicon area doing so.

This invention results from the realization that a free running loop oscillator can be used to divide time into very small intervals because even if the actual period of the oscillator is not known and/or varies, the state of the oscillator at any given time can be determined such that the number of cycles and fractional cycles of the oscillator between two unknown instants of time can be calculated based on the state changes of the oscillator between two known time reference points. This invention results from the further realization that taps disposed between the delay elements which make up the oscillator can be used to provide multi-phased signals which can then be utilized to create generated transitions at almost any point in time because, even if the amount of delay between any two taps varies widely, the properly phased tap signal can be chosen ahead of time by calculating the oscillator speed such that more finely addressable transitions can be output from the circuit to drive, for example, a printer's laser diode.

This invention features a unique free-running loop oscillator including a set of delay elements connected in series forming a free-running loop oscillator, a set of is taps disposed between adjacent delay elements, means for determining the speed of the free-running loop oscillator, and means for choosing a given tap in response to the determined speed of the free running loop oscillator thereby providing finely addressable signals which can be selected by choosing the appropriate tap.

Incorporated in an interval timer, there are means for determining the number oscillations of the free loop oscillator between an interval event start time and the interval end time, and means for calculating the time elapsed between the interval start time and the interval end time by dividing the number of oscillations of the oscillator between the interval start time and the interval end time by the speed of the oscillator. There is a lap counter connected to the oscillator for counting the number of complete cycles of the oscillator and means for latching the state of each tap at the interval start time and at the interval end time. There are also means for computing the fractional portion of the cycle of the oscillator between the interval start time and the interval end time.

The loop speed is calculated by using a reference clock and means for determining the number of complete cycles of the oscillator between two reference-clock signal edges. There are a set of taps disposed between each adjacent pair of the delay means and latch means for latching the state of each tap on the two reference-clock signal edges. In this way, the fractional portion of a cycle of the oscillator is calculated.

This invention also features a free loop modulator comprising a set of successive delay means connected in series forming a free-running loop oscillator; a set of successive taps disposed between the delay means, each tap providing a differently-phased oscillator signal; means for defining the desired time of a signal transition, means for determining which tap signal contains a transition proximate the desired time; and means for selecting the tap signal which contains a transition proximate the desired time. Further included are means for propagating the selected tap signal transition to the output of the free loop modulator. Each delay means typically comprises at least one inverter elements and each tap is typically located between a plurality of inverter elements. The output signal is used to drive a laser printer's printing diode.

In an optional embodiment, there are additional delay elements driven by the loop taps but not part of the loop. If these external delays are appropriately chosen, e.g. 15% of the delays within the loop, their opposite ends provide the equivalent signals as if there were intemediate taps on the loop. Using this technique. "tap" spacings can be simulated which are a submultiple of the smallest active delay element e.g. a single inverter, that would otherwise be available in a given chip technology. For example, if a single inventor is 100 pico seconds (typical), this technique could provide 50 pico second or even 25 pico second addressability.

The means for determining the desired time of a transition includes means for receiving a first signal indicative of the location of a transition within a print cell when the free loop modulator is embodied in a printer controller. The means for determining which tap signal contains a transition proximate the desired time includes means for computing the tap containing a transition at the location represented by the first signal and means for generating a second signal represented the computed tap. The means for selecting typically includes one or more multiplexers having a plurality of gates each connected to a tap and also connected to the means for generating, for propagating the tap signal corresponding to the transition desired. Further included are means for counting each lap of the oscillator and means for latching the state of each lap. The means for latching includes two latches for separately latching the positive and negative transitions of each tap at each lap.

The means for determining further includes means, responsive to the means for latching, for determining the speed of the oscillator. Also included are means for computing a cell boundary position for the desired signal transition. Finally, there are means, responsive to the cell boundary position, responsive to the speed of the oscillator, and responsive to the desired time of the signal transition, for computing both the tap and lap of the oscillator which provides that desired transition signal.

This invention also features a timer comprising a reference clock for delivering clock cycles of a known frequency, means for determining an unknown period of time including the free running loop oscillator described above, one latch for latching the state of the oscillator at the beginning and end of the unknown time period, a second latch for latching the state of the oscillator at two reference clock pulses, and means, based on the change of state of the oscillator during the unknown time period and the speed of the oscillator during the unknown time period, for calculating the actual time period.

In a more general sense, this invention features a free loop oscillator system comprising a set of successive delay means connected in series forming a free-running loop oscillator, a set of taps disposed between the delay means, means for determining the speed of the free-running loop oscillator, and means for choosing a given tap in response to the speed of the free running loop oscillator. Such a system may be implemented as a part of interval timer, video signal controller, a frequency synthesizer, an FM modulator, a digital to analog converter, or any other device which requires the availability of finely addressable signals.

DISCLOSURE OF PREFERRED EMBODIMENT

Other objects, features and advantages will occur to those skilled in the art from the following description of a preferred embodiment and the accompanying drawings, in which.

Figure 1:
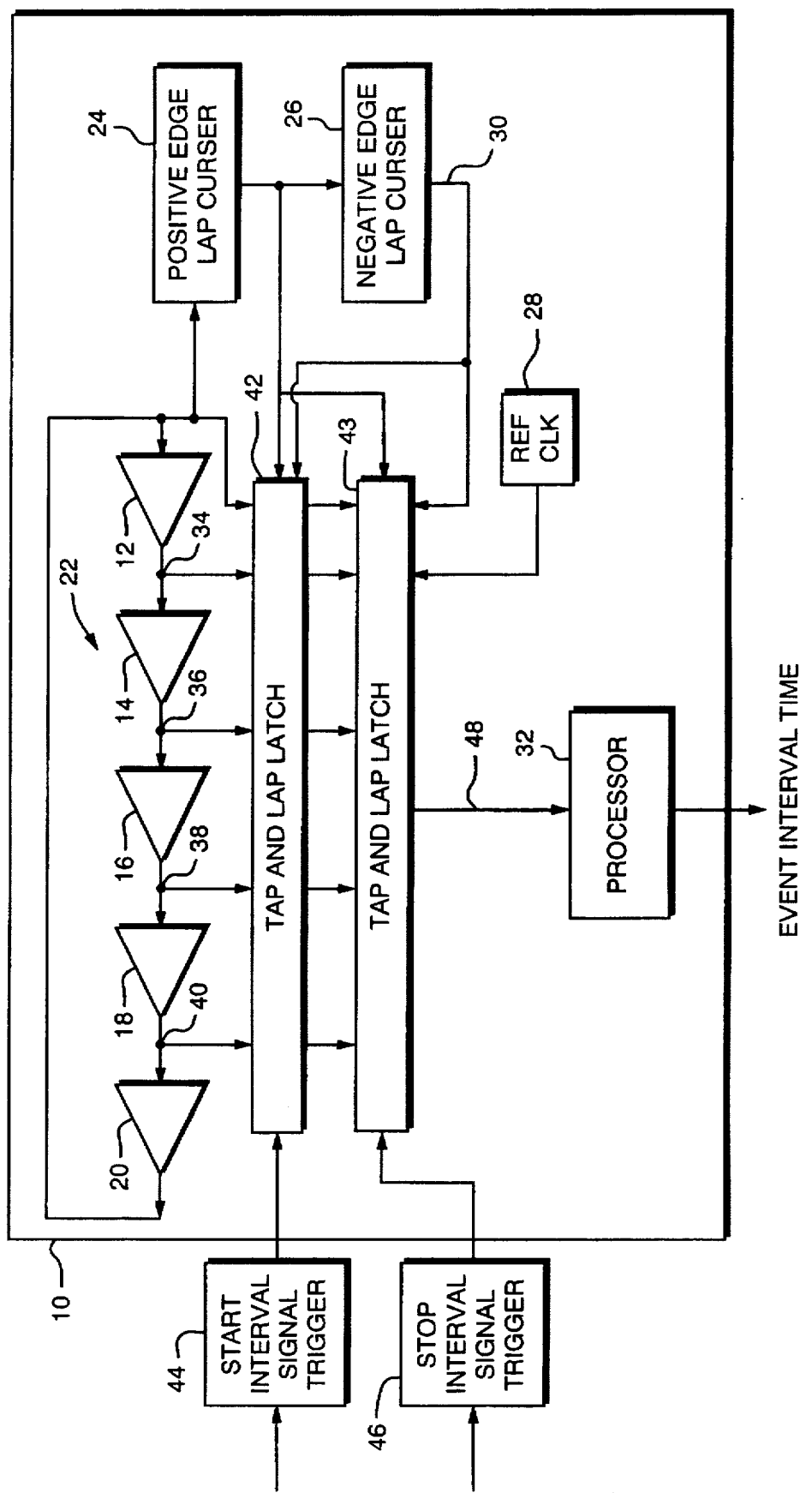
FIG. 1 is a block diagram of one embodiment of the subject invention used as an interval timer.

Interval timer 10, FIG. 1, includes delay elements 12, 14, 15, 18 and 20 connected in series as shown forming a free running loop oscillator 22. Delay elements 12, 14, 16, 18, and 20 are typically one or more inverter elements each having an inherent delay such as a 0.1 nanosecond (typical). If there are three inverters per delay element, then the total delay through any one delay element 12, 14, 16, 18 or 20 will be 0.3 nanoseconds (typical). The number of delay elements and the number of inverters per delay element is a design choice depending on the requirements of timer 10 but there should be net odd number of inversions to create free running loop oscillator 22.

Interval timer 10 also includes positive-edge lap counter 24 which advances on each complete oscillation of oscillator 22 and negative-edge lap counter 26 which counts 180 degree out-of-phase with counter 24.

The actual number of oscillations of oscillator 22 during a given time interval includes the number of complete cycles of oscillator 22 (which may be zero) as determined by lap counter 24 and the number of fractional cycles of oscillator 22. The fractional portion of a cycle of oscillator 22 is determined by providing taps 34, 36, 38 and 40 between each delay element 12, 14, 16, 18 and 20 and using tap and lap latch 42 to store the state of each tap of oscillator 22 when the latch 42 is triggered.

Thus, by triggering the operation of a first latch 42 at the start of a time interval as shown by trigger 44 and then triggering the operation of a second latch 43 at the end of the interval as shown by trigger 46, the number of complete and fractional cycles of oscillator 22 which occurred during the event can be determined by processor 32 via data provided by latches 42 and 43 over line 48. The result is the time interval time in units of tap delays. The signal available to processor 32 on line 48 also includes the number of oscillations and fractional oscillations of oscillator 22 in one reference clock 28 period i.e., the speed of oscillator 22. Processor 32 then calculates the actual event interval time period by dividing the interval time period in units of tap delays by the number of tap delays per reference clock period (loop speed). Note that the delay of each delay element 12, 14, 16, 18, and 20 and the actual time in nanoseconds between the oscillations of oscillator 22 need not be computed.

Figure 2:
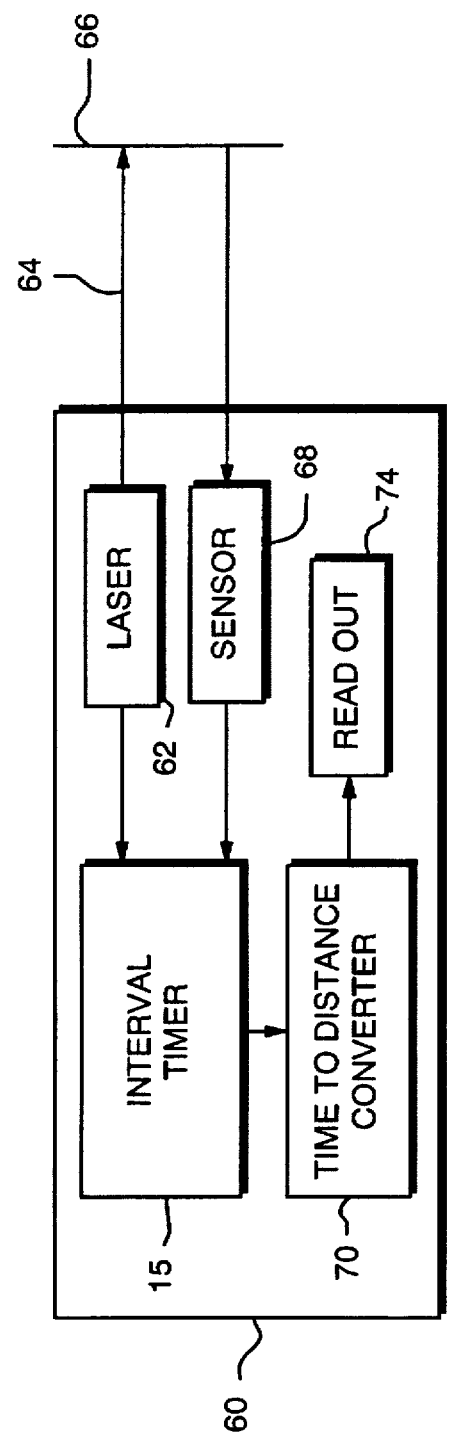
FIG. 2 is a schematic block diagram of the timer shown in FIG. 1 used in a distance measuring device.

Range finder 60, FIG. 2 is but one useful embodiment of interval timer 10, FIG. 1. Range finder 16 includes the laser source 62 which generates a laser beam pulse 64 which strikes object 66 and is then reflected back to range finder 60 to be detected by sensor 68. The goal is to accurately time the time interval t between the time $t_1$, FIG. 3A, that the laser pulse left range finder 60 (interval start time) and the time $t_2$ that the reflected laser pulse returns and is sensed by sensor 68 (interval end time).

Figure 3:
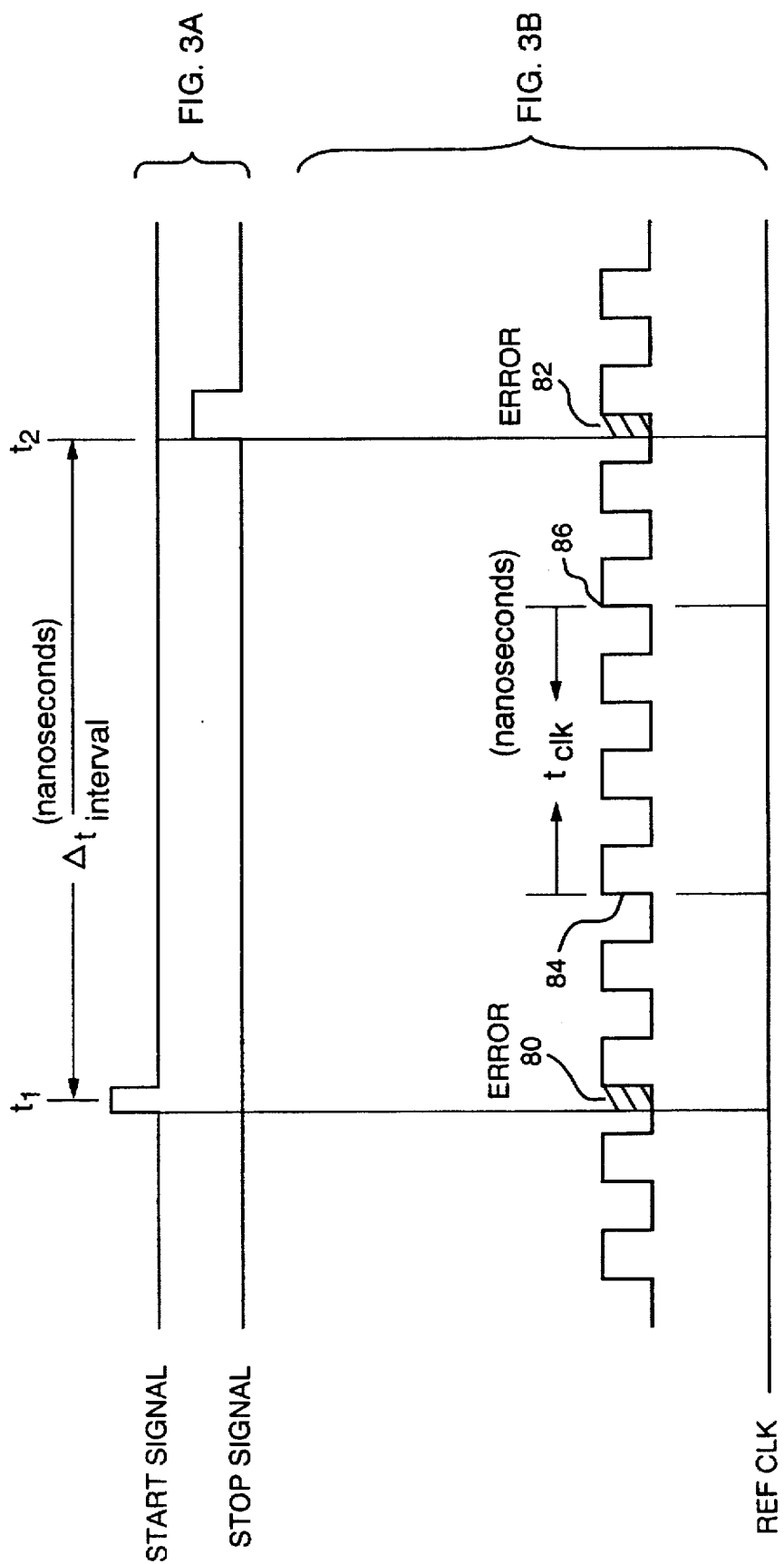
FIG. 3 is a timing diagram depicting the operation of the timer shown in FIG. 1 and FIG. 2.

The prior art's use of a reference clock to determine the interval time t is shown in FIG. 3B, but, because $t_1$ and/or $t_2$ may occur between cycles of the reference clock, errors may occur such as shown at 80 and 82 in measuring the start and end time of interval t which subsequently results in inaccurate distance calculations.

In this invention, however, reference clock 28, FIG. 1 is used to latch the state of free running loop 22 (including lap counters) between two selected reference clock edges 84 and 86, FIG. 3B and processor 32, FIG. 1, then determines the speed of oscillator 22 as described above in units of tap delays per reference clock period. To eliminate errors 80 and 82, FIG. 3B, the much finer transitions available on taps 34, 36, and 40, of oscillator 22 of FIG. 1 are used to calculate the time interval Δt in units of tap delays as shown by latching the state of oscillator 22 at time $t_1$ and then again at time $t_2$. From this information, processor 32 determines the number of complete and fractional cycles of oscillator 22 which occur between time $t_1$ and time $t_2$ and then divides this number by the number of tap delays per reference-clock period (the oscillator loop speed) to very-accurately measure time interval time Δt. The number of taps would generally be chosen a power of two to simplify the calculations and minimize the required circuit gates.

Range finder 60, FIG. 2, then presents this interval time Δt as an input to time-to-distance converter 72 thereby providing the range to readout unit 74.

Thus, a very accurate interval timer is accomplished using only a relatively low frequency (and hence) manageable reference clock by using the reference clock only as a means to calibrate the speed of oscillator 22, FIG. 1 and to clock data. The device actually operates at the resolution of the delay units instead of the reference clock period and only uses the much coarser reference clock cycles to latch the state of the oscillator in order to determine the speed of the free-loop oscillator. Processor 32 may perform the necessary calculations via the appropriately programmed computer instructions or processor 32 may actually be a set of hard-wired adders and dividers known in the art to accomplish the equivalent result.

In summary, free running loop oscillator 22 has a high frequency which need not be pre-determined since the fixed frequency reference clock is used to determine the loop speed in terms of delay elements per reference clock period. Then, an unknown time period can be precisely measured by latching the state of the free-running loop at the beginning and end of the time period and dividing this result by the loop speed.

Figure 4:
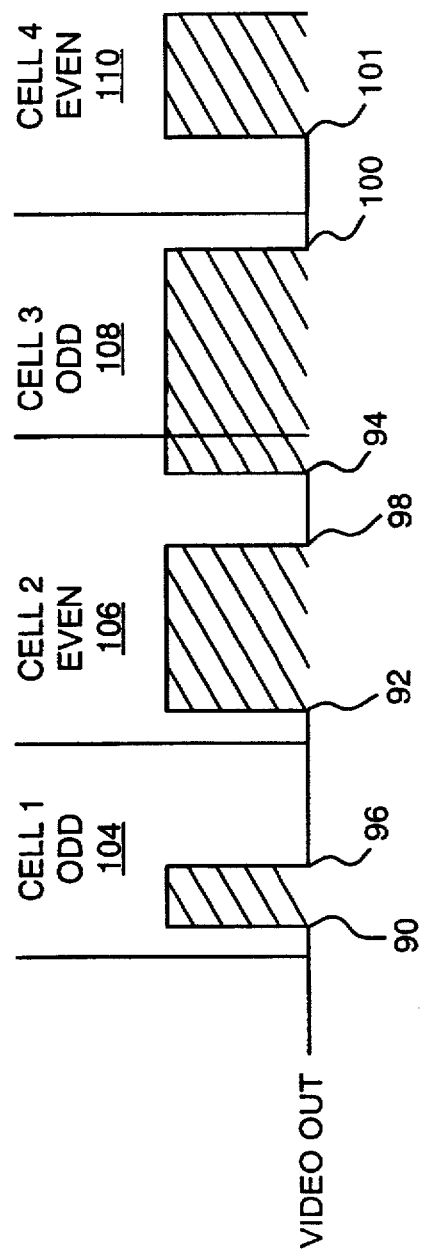
FIG. 4 is a timing diagram of a video out signal to drive a printer's laser diode for creating intracell to-black and to-white transitions in accordance with this invention.

Oscillator 22 of this invention is also useful in a free loop modulator used to provide a video signal, comprising white-to-black transitions 90, 92 and 94 and black-to-white transitions 96, 98, and 100 within print (or other) cells 104, 106, 108 and 110, FIG. 4 to provide high print resolution via accurately placed transitions of a laser printer's print diode.

Figure 5A:
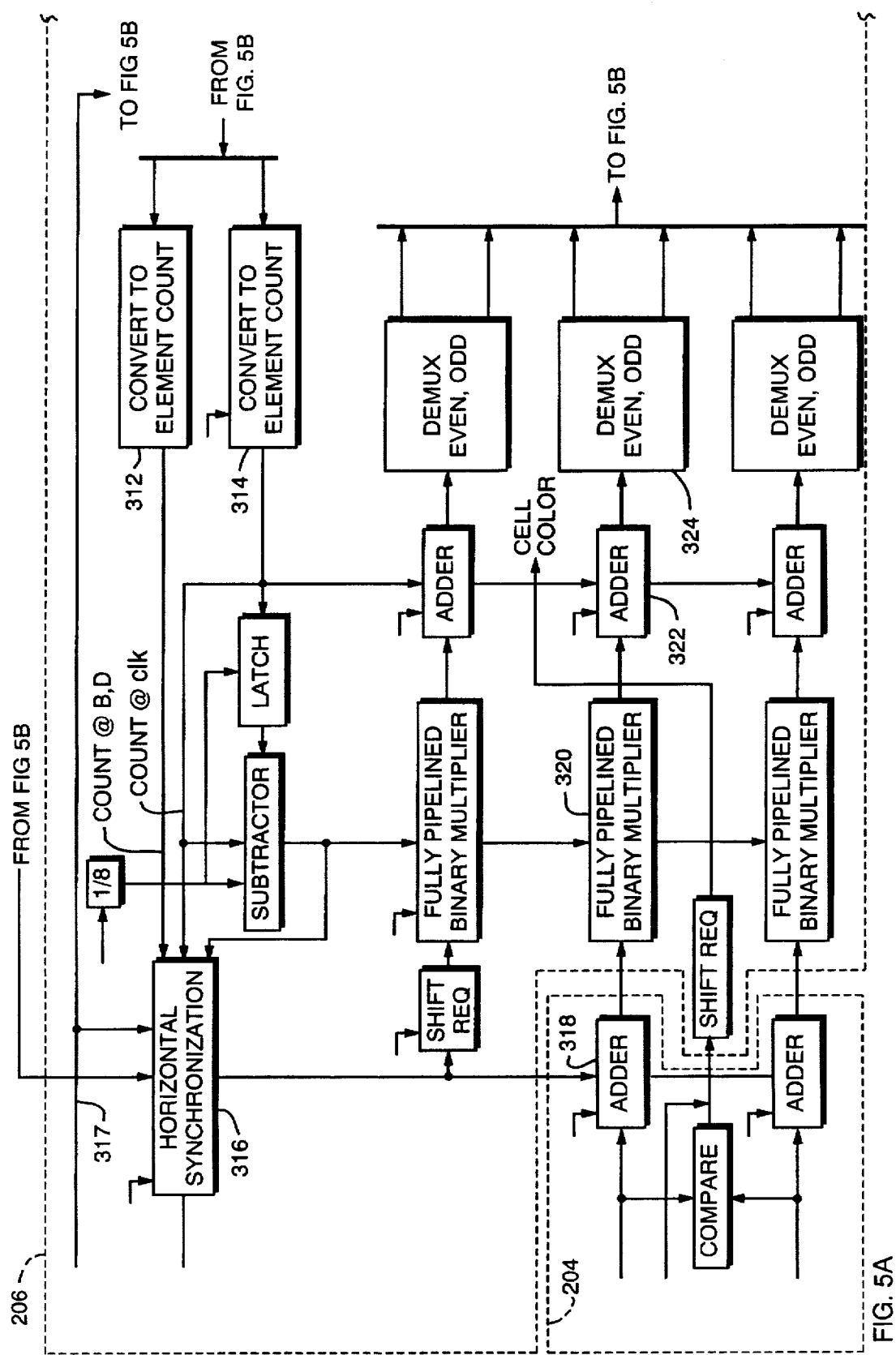
FIG. 5 is a block diagram of the free-running loop modulator according to this invention which provides the finely addressable video out signal shown in FIG. 4.
Figure 5B:
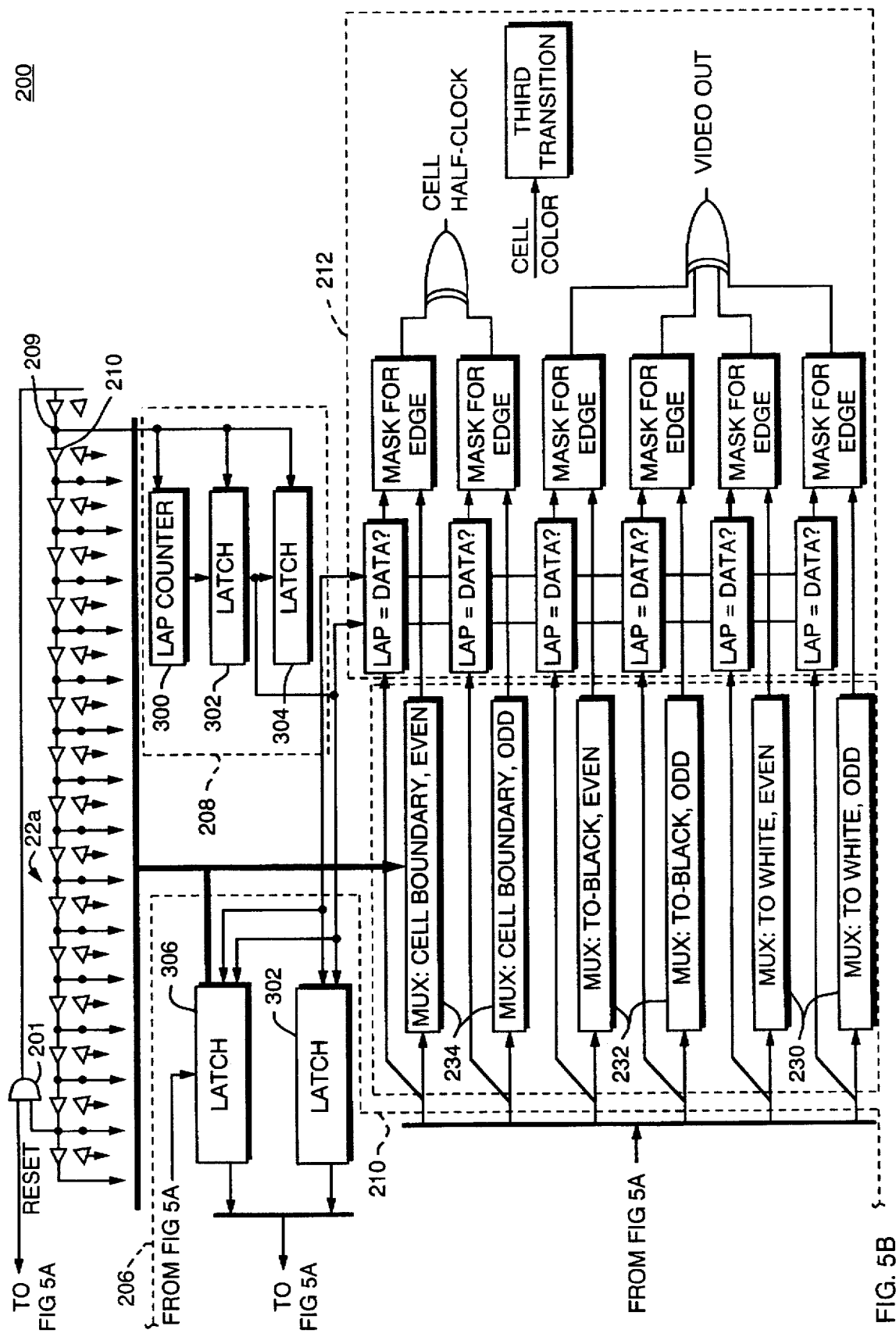

In this embodiment, the video out signal shown in FIG. 4 is generated by free loop modulator 200, FIG. 5, incorporating free-running loop oscillator 22a comprised of 16 delay elements 210, 212, 214, etc. each comprising three inverter elements thereby providing a 0.3 nanosecond typical delay between adjacent taps 218, 220, 222, etc. In an optional embodiment, there may be additional off-loop delay elements faster or slower than the loop delay elements thereby effectively providing intermediate taps on the loop and doubling (or better) the timing accuracy as shown in FIG. 5.

In general, oscillator 22a is a free running ring oscillator consisting of a series of delays 210, 212, 214, etc. There may be 8, 16, or 32 delays depending upon the design trade-offs. If a set of non-power of two elements are used, additional arithmetic circuitry will be required. A higher number results in lower ring frequencies but a greater number of time-sensitive signal lines into multiplexing circuit 210. Although there are typically an even number of equally spaced taps 218, 220, 222, etc., the delay sequence nonetheless is wired to have a net odd number of inversions to permit oscillation. Preferably, each tap is inverted from the previous tap, except the first, to average out for differences between rising and falling edge propagation delays. The speed of the free-running loop varies by about a factor of three because of integrated circuit process, temperature, and voltage. Oscillator 22a creates little power supply noise because the circulating transition is always active somewhere. Reset 201 is used to reset the state of oscillator 22a at least at power-on to prevent higher-multiple harmonic oscillations. In the laser printer environment, modulator 22a is reset before every laser line. In continuous devices such as a frequency modulator, the reset only occurs once at start-up.

The use of oscillator 22a obviates the need for external delay lines, external tuning components, or any analog circuitry of any kind and allows the circuit to operate over a wide range of pixel clock 310 rates without adjustment or change. It can also be used in a device which switches printer DPI rates electronically. The fact that the loop speed is unpredictable is corrected by measuring the loop speed continuously and correcting for it in a none-time-critical data handling circuit represented by transition algebra circuitry 206. If desired, the taps can effectively be placed at half or one quarter an inverter's delay apart by using faster and slower inverters 22a and 22b, respectively. A typical ultimate time resolution of plus or minus about 15 picoseconds can thus be achieved if the integrated circuit layout is carefully controlled.

Loop oscillator 22a is a high frequency loop that clocks binary counter 300 of loop speed circuitry 208. The state of counter 300 is recorded on both edges of the tap zero, signal 209, by latches 302 and 304. Therefore, there are actually two lap counters, one in-phase and one out-of-phase, so that one always has valid data while the other is switching. The lap counter has enough bits to not roll over more than once within the latency period of the entire circuit, about 8 pixel clocks. The purpose of recording both lap counter phases is to provide stable counts to the subsequent processing circuitry by selecting which phase of the lap counter to reference, that is, to inhibit using the lap counter phase that is currently being clocked. The state of loop 22a and lap counters is sampled at the beginning of the print line at the beam detect "BD" time as input on line 317 to latch 306 to obtain the phase of the BD signal relative to the reference pixel clock. Modulator 200 obtains the speed of the loop by subtracting two converted binary states of the loop taken 8 pixel clocks apart. This enables modulator 200 to calibrate the loop speed in units of tap delays per pixel clock (310) period. As an example, if it was determined that there were 1,000 tap delays during 1 pixel clock period, a point 50% through the period would be 500 tap delays from the start of a print cell. Synchronization of the BD signal is very important to the quality output and is accomplished by horizontal synchronization circuit 316. The mechanical repeatability of the left-edge signal of the device and the error associated with it would otherwise seriously impair line-to-line accuracy. Horizontal synchronization circuit 316 samples the loop at BD time and provides the value for the cell boundary that is consistent with the smallest possible error.

Modulator 200 includes means for defining the desired tap signal and the desired transition within that tap signal to create a desired output transition (e.g. transition 90, FIG. 4) in the form of transition algebra circuitry 206, FIG. 5, including horizontal synchronization circuitry 316 which utilizes the speed of the oscillator 22a in units of delay elements. Modulator 200 also includes multiplexing circuit 210 for selecting appropriate tap waveforms transition at appropriate times and also masking circuitry 212 for passing the desired transitions to the video out signal, as shown in FIG. 4, which produces transitions within print cells (e.g. transition 90, FIG. 4).

In this way, modulator 200 creates a bi-level video signal to drive a laser printer's laser diode. The transitions in that video signal (e.g. white-to-black or black-to-white) have a very fine time addressability, e.g. 1 nanosecond, much finer than the reciprocal of the highest frequencies in the system.

The inputs to the modulator are binary data controlling the locations of the transitions in the output waveform. External pixel clock 310 (also serving as the reference clock) defines the operating speed of modulator 200. Its period defines the cell duration and is normally the video frequency of the printer (not shown). Pixel clock 210 also clocks the input data. An input BD signal edge from the printer defines the position of cells relative to the pixel clock and also locates a first pixel off the edge of the paper. Modulator 200 outputs a "first pixel" pulse synchronous with the pixel clock 210, to begin the transmission of data to it for each line.

The input data is in the form of two fractions of up to ten bits in length. The data is supplied synchronous with the pixel clock, not the output cells, but refer to the output cells. One word, to-black-data, defines the location that the laser is to turn on within each cell, specified as a fraction of a cell. Thus, 0.1000000000 would define half-way through the cell or 50 nanoseconds if the pixel clock is 10 mhz. Likewise, to-white-data defines the turn off time of the laser within that cell. If to-white and to-black are equal, no pulse is produced in the cell. If to-white occurs first, the cell is rendered black with a white pulse in it by inserting a third transition at the beginning of the cell. The pixel-clock-synchronous two-bit input signal "cell color override" can also force the cell to be black-starting or white-starting and force "to-white" and "to-black" to be reversed inside the modulator if necessary.

A third fractional input, "shift-cells" (8-bits, pixel-clock-synchronous) allows groups of cells within the whole line to be shifted an arbitrary fraction of a cell. This input is used to making variable half-tone screen angles, especially for color. Fixed (ground or VCC) input signals specify BD polarity and output video polarity.

Modulator 200, in order to generate a transition within a print cell, such as transition 90, 96, etc. FIG. 4, must determine which tap 218, 220, 222, etc. of oscillator 22a and which lap of oscillator 22a will provide the correct transition. To accomplish this task, input position circuitry 204 defines the desired position and polarity of a transition (within in a given cell), and transition algebra circuit 206 determines which tap's signal contains the closest transition to that location based on the oscillator speed determined by the subtractor. Then, multiplexing circuit 210 selects the appropriate tap based on a digital word supplied to it and masking circuitry 212 selects one transition from that tap-signal and includes it in the "video-out" signal from modulator 200. Each circuit is discussed in turn.

Figure 6A:
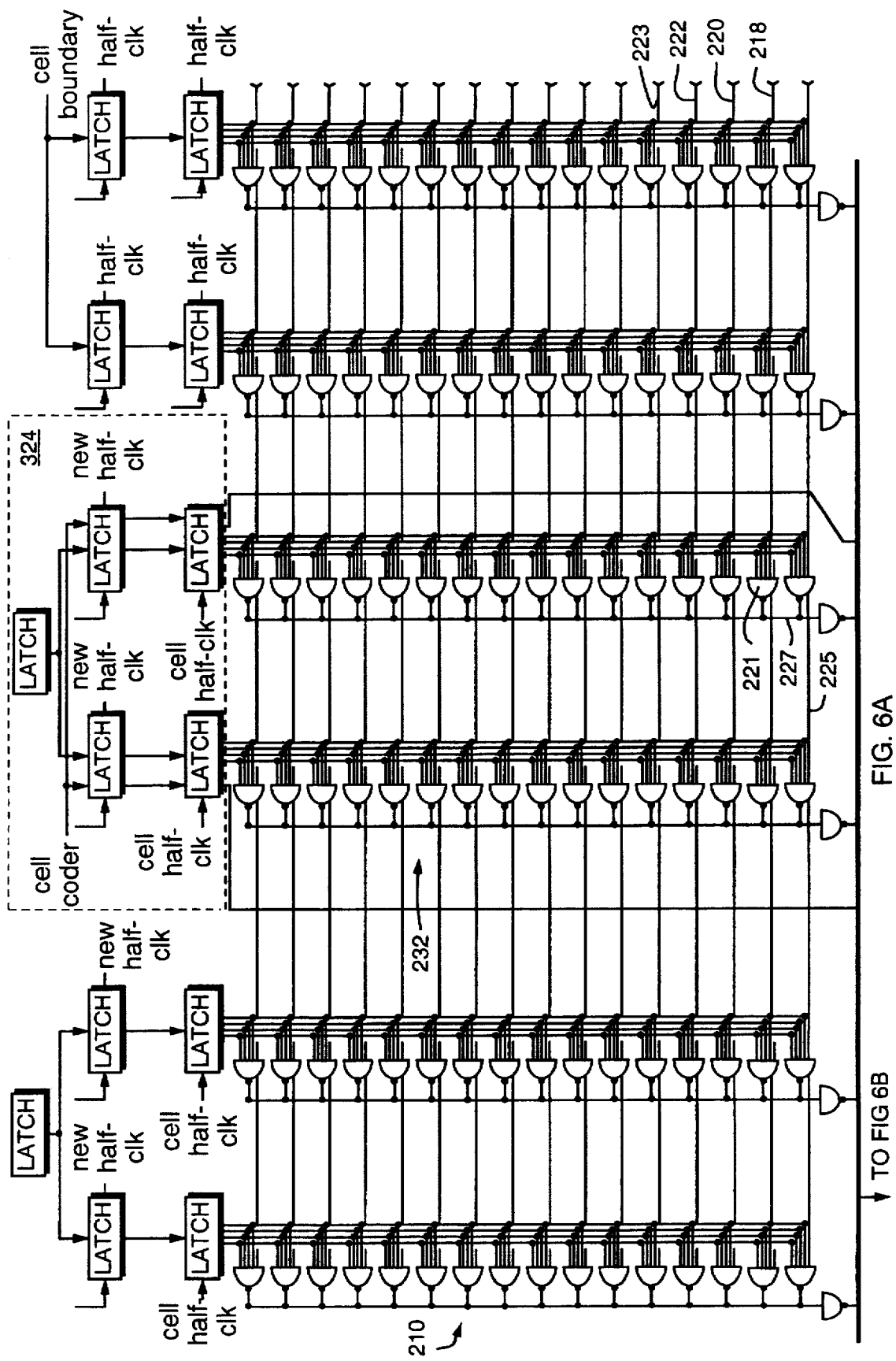
FIG. 6 is a more detailed circuit diagram of the multiplexers and video flip-flop circuitry of the modulator shown in FIG. 5.
Figure 6B:
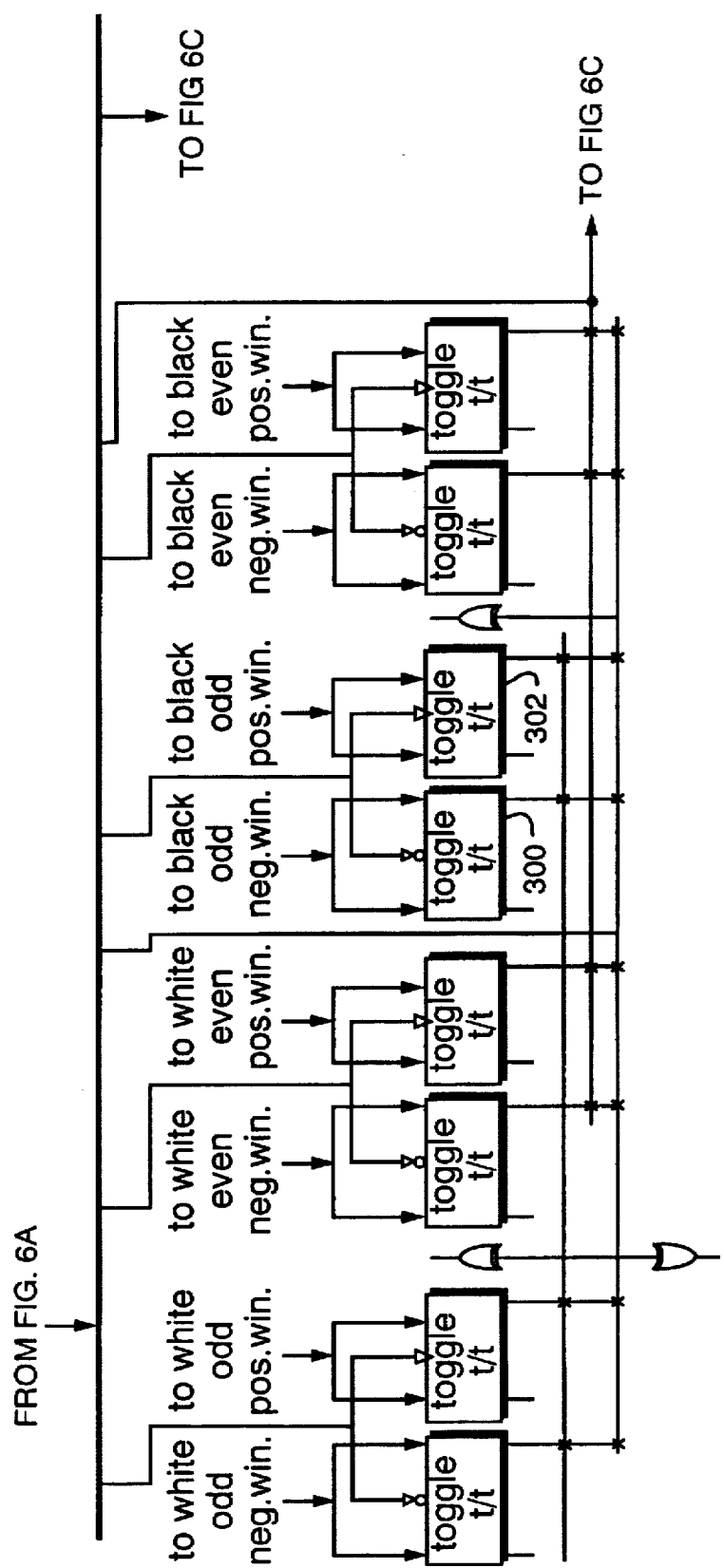
Figure 6C:
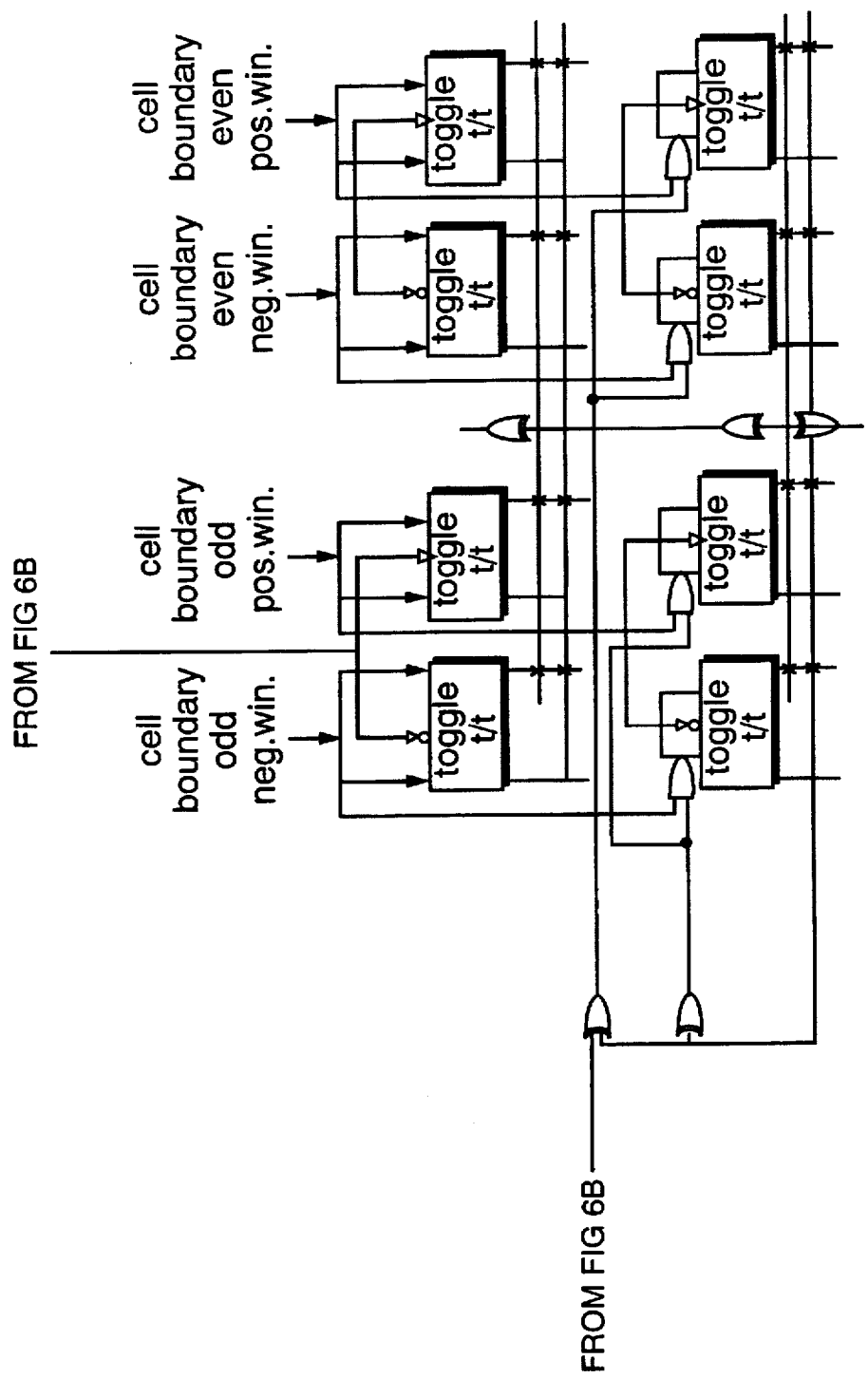

Transition algebra circuit 206 supplies a 15 bit binary word to multiplexing circuit 210 and masking circuit 212 shown in more detail in FIG. 6. The low 4 bits of the 15 bit binary word represent the selected tap, e.g. tap 218, 220, or tap 222. These four bits are, for example, delivered to the AND gates shown, for each tap, such that 0001 would trigger AND gate 221 to allow the signal present on tap one, 218, to proceed on line 227. The next (5th least significant) bit of the digital word represents which transition polarity on that tap is to be selected (1 is a negative-going transition; 0 is a positive-going transition) and the high 10 bits represent the selected lap count.

Multiplexing circuitry 210 thus selects the tap to be used for a desired transition. The individual multiplexors operate in pairs, one for the odd cells, 104, 108, FIG. 4, and one for the even cells 106, 110 which permits seamless boundaries between the cells by allowing various settling times to expire. There are three pairs of multiplexors: to-white 230, FIGS. 5 and 6, to-black 232, and the cell boundary pair 234 which provides a possible third transition as well as the internal "cell half-clock" signal which is synchronized to BD. The multiplexors carry time-sensitive edges and thus are laid out on the integrated circuit to avoid excessive skew.

As each alternate cell is being imaged, all calculations and settling for the following cell occur and when the current cell period is complete and switches, everything is stable for imaging the next cell, the process is repeated through the line cell by cell.

To determine which lap is occuring at any given point in time, lap counter 300, FIG. 5, counts every cycle of tap 209 (Tap zero) and latch 302 stores on every positive tap zero transition, providing an in-phase lap-count signal on line 303 while latch 304 stores on every negative tap zero transition providing an out-of-phase lap count signal on line 305 to be supplied to latches 306 and 308 of transition algebra circuit 206. The reason for separately latching on positive and negative tap zero transitions is to assure the availability of stable lap-count data at all times.

Figure 11:
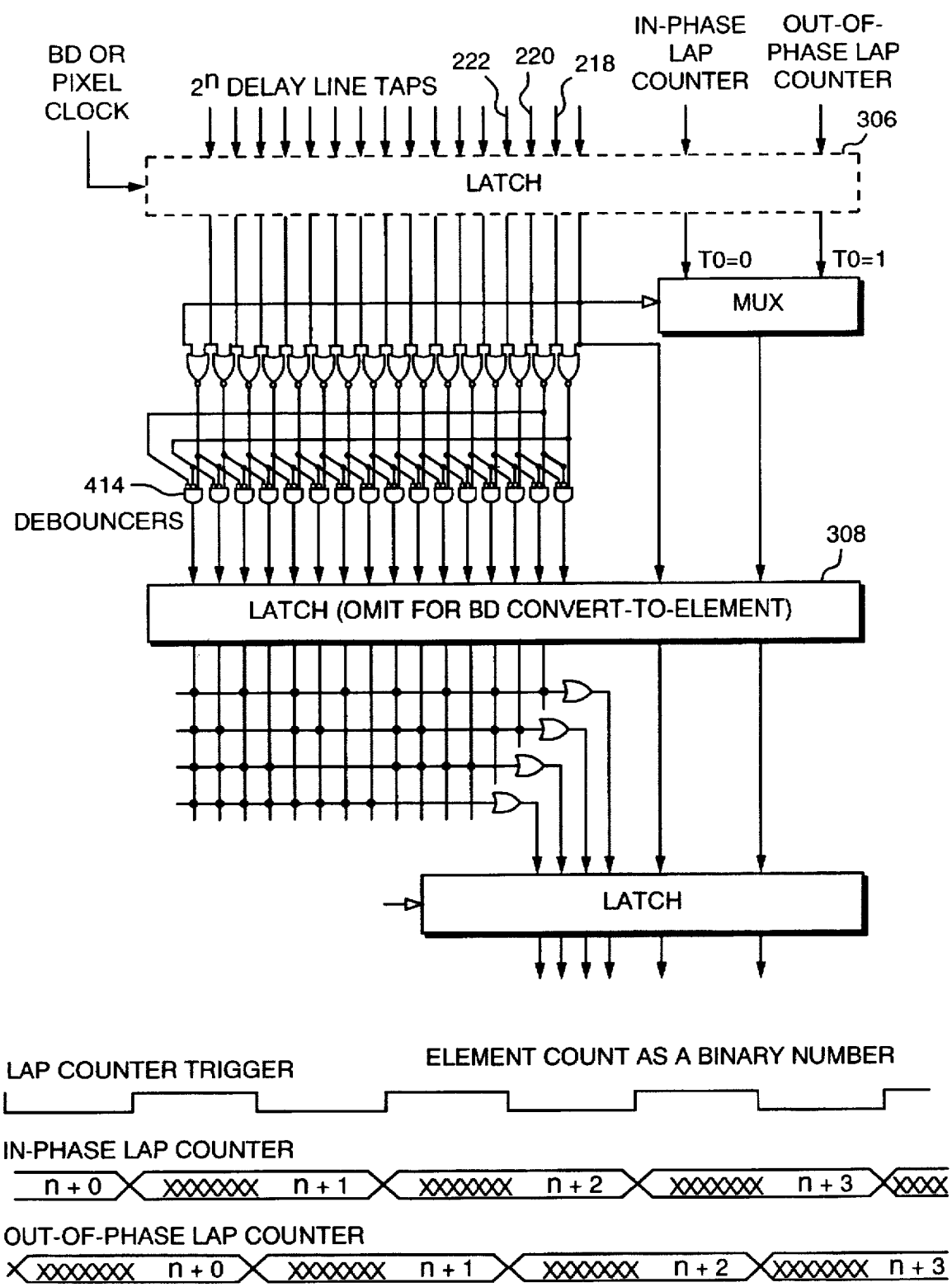
FIG. 11 is a more detailed circuit diagram of the convert-to-element count circuitry of the modulator shown in FIG. 5.

Latch 308 captures the state of loop 22a and lap counter 300 every pixel clock edge supplied by pixel clock 310, and latch 306 captures the state of loop 22a and lap country 300 at the BD edge. Convert-to-element count circuits 312 and 314 then convert these captured states to 15-bit binary numbers representing time in units of delay elements as shown in FIG. 11.

Figure 10:
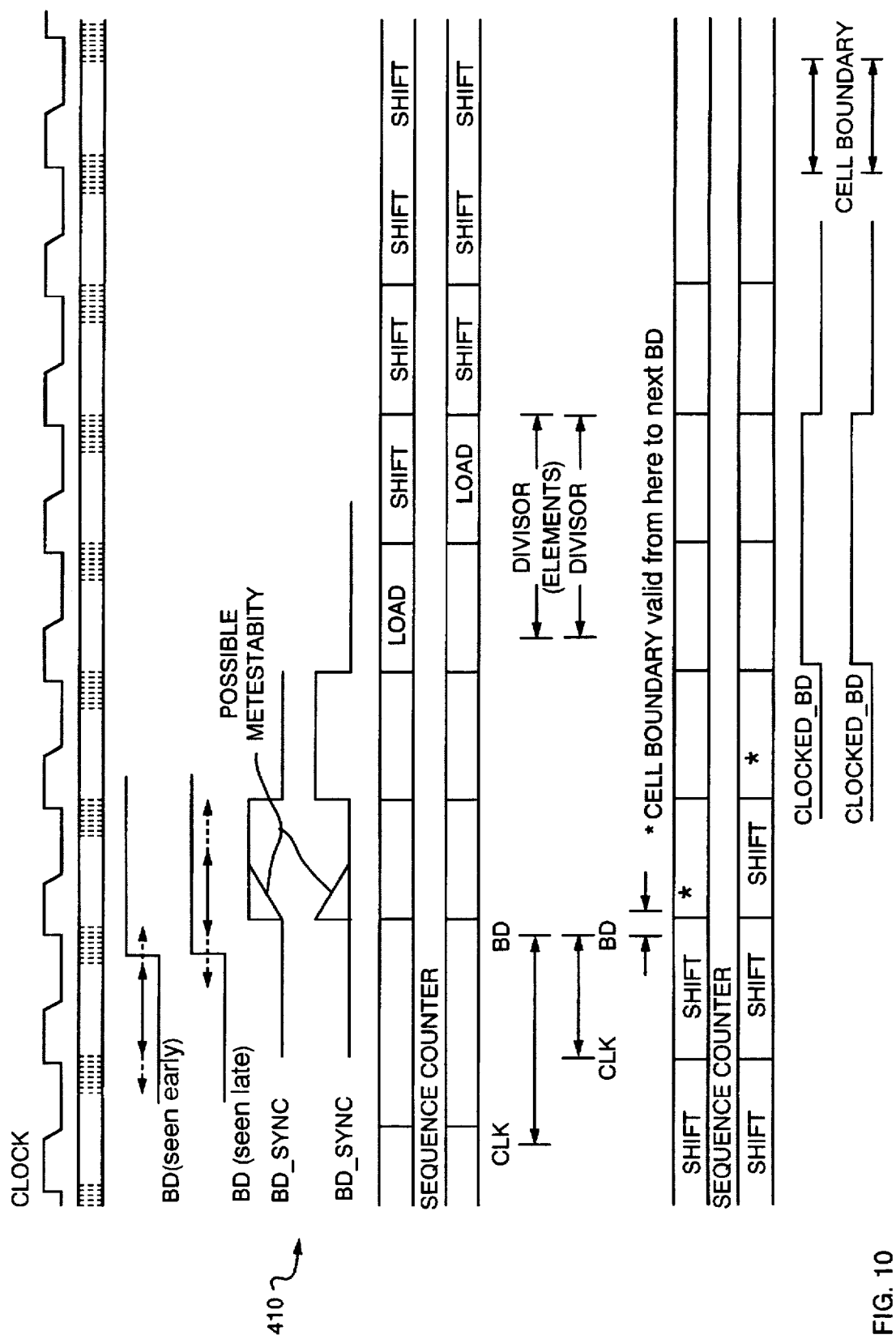
FIG. 10 is a timing diagram depicting the operation of the horizontal synchronization circuitry shown in FIG. 9.

These two binary words are supplied to horizontal synchronization circuitry 316, also shown in FIG. 10, which precisely locates the BD signal and provides a value representing the cell boundary (between 0 and 0.999).

To run through but one example, if it were desired to go black ⅓ of the way through a cell, (e.g. transition 90, FIG. 4) the input to-black transition binary fraction would be 0.0101100110. If the BD signal occurred half-way through a pixel clock period the cell boundary binary fraction would be 0.10000000. Adder 318 would then add the two numbers and produce 0.1101100110 to which 6 is appended yielding 110.1101100110 to be supplied to multiplier 320. A loop speed of, for example, 387.25 taps/cell (110000011.010 binary) is also delivered to multiplier 320 as discussed above, determined by subtracting two convert-to-element outputs eight pixel-clock periods apart. The product is 000101001010110 (dropping fractional taps) which is supplied to adder 322. Adder 322 also receives the "count-at-clock" signal which could be 011 0110 0001 1110 (binary) taps which is added (carry, if any, dropped) to the above binary number to produce the 15 bit digital word 100000001110100 supplied to the demultiplexer 324 for pipelining to the correct portion of multiplexing circuitry 210, and masking circuit 212 at the pixel clock data rate. Cell 104, FIG. 1 being an odd cell, means that multiplexer 232 receives this digital word (see FIG. 6) the low 4 bits of which designate tap 222 (tap 4), the next bit of which designates the polarity (a negative going transition) and the high ten bits of which designate the lap count.

Figure 7:
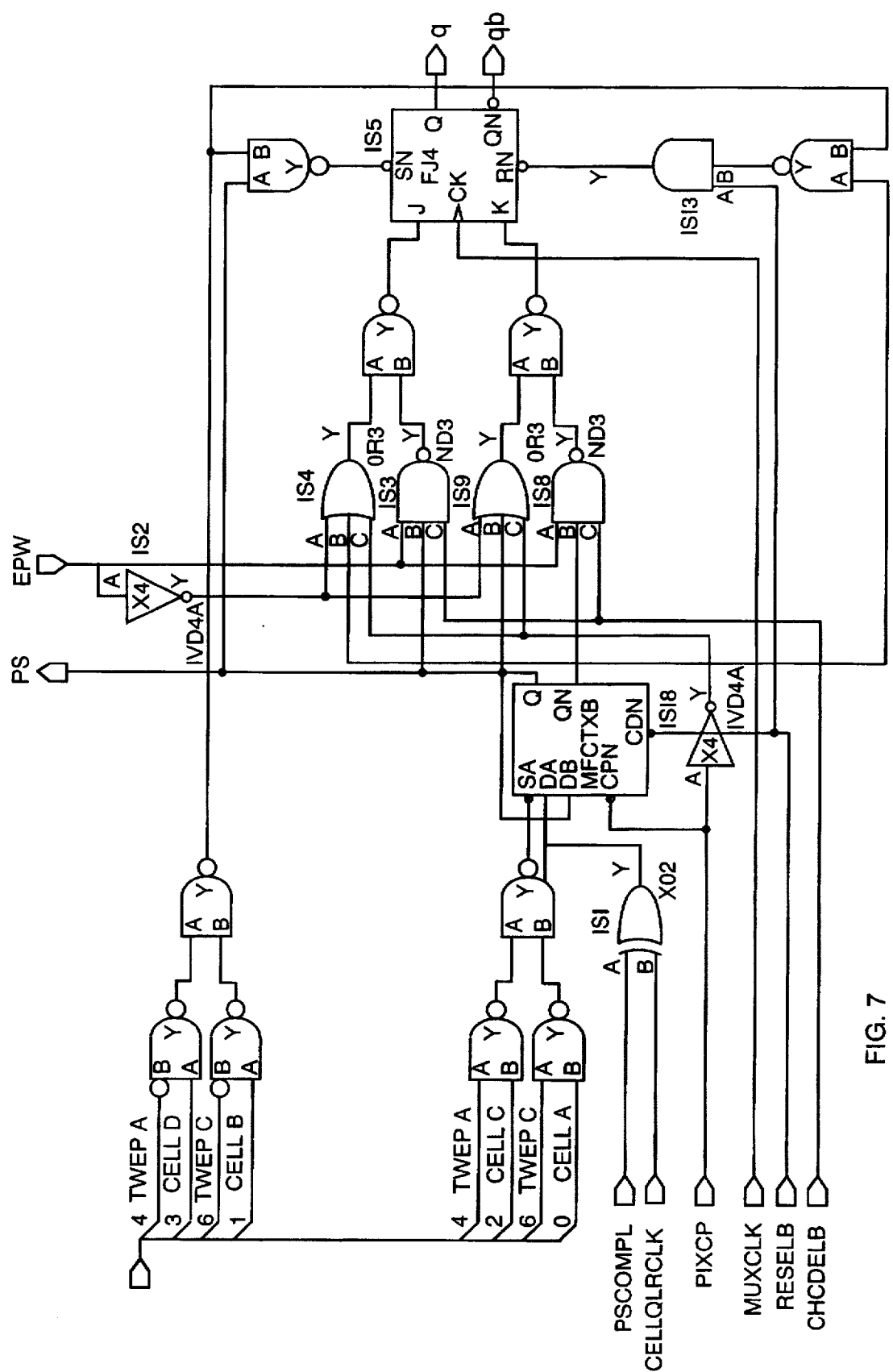
FIG. 7 is a more detailed circuit diagram of one video flip-flop shown in FIG. 6.
Figure 8A:
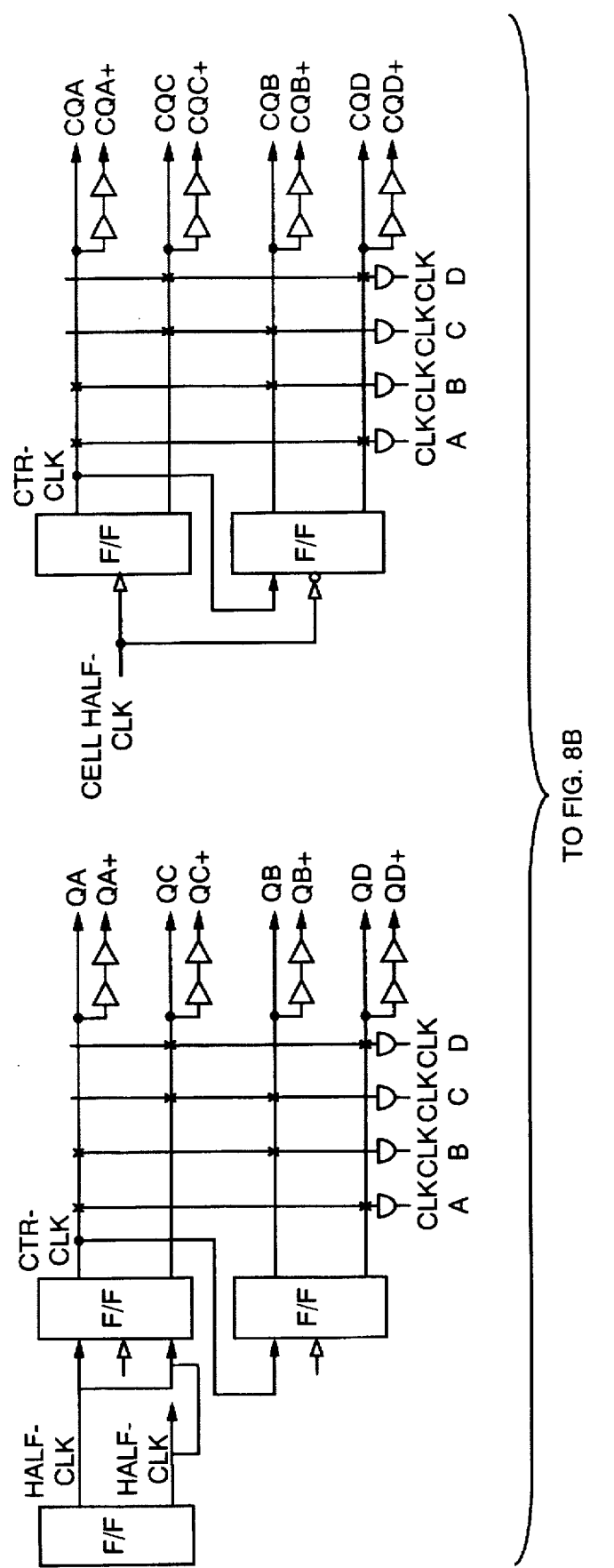
FIG. 8 is a more detailed circuit diagram of the mask-for-edge circuit of the modulator shown in FIG. 5.
Figure 8B:
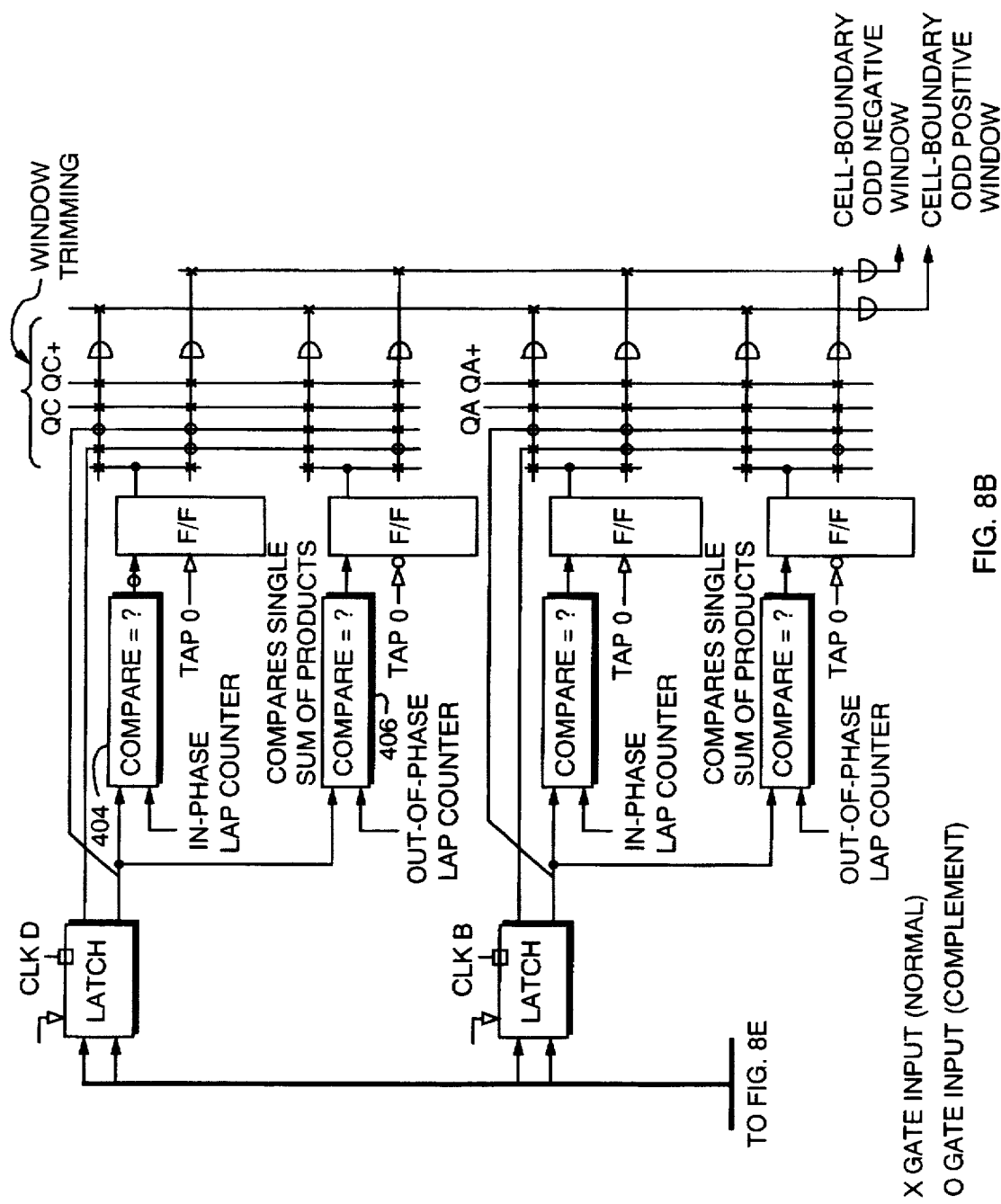
Figure 8C:
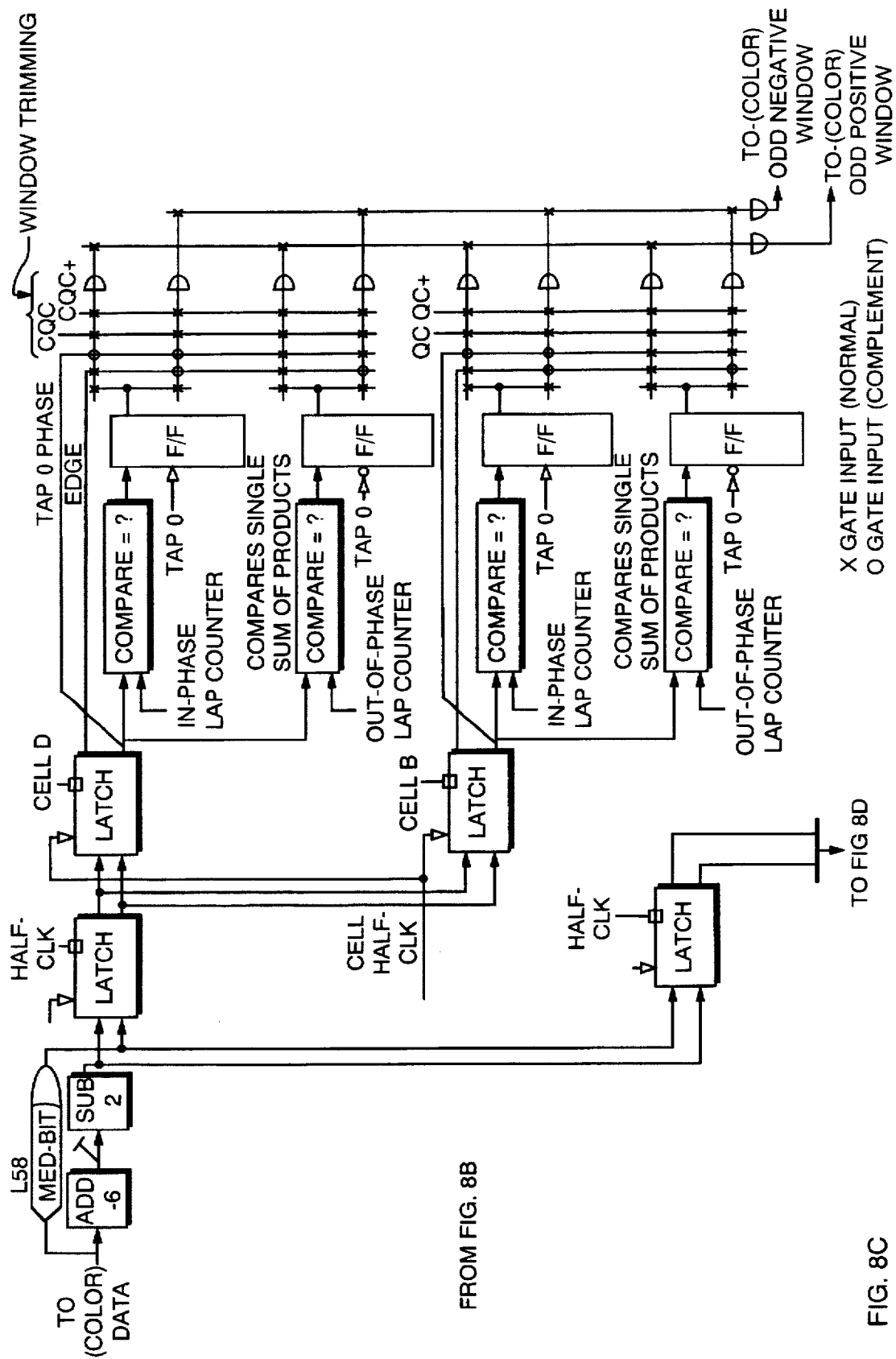
Figure 8D:
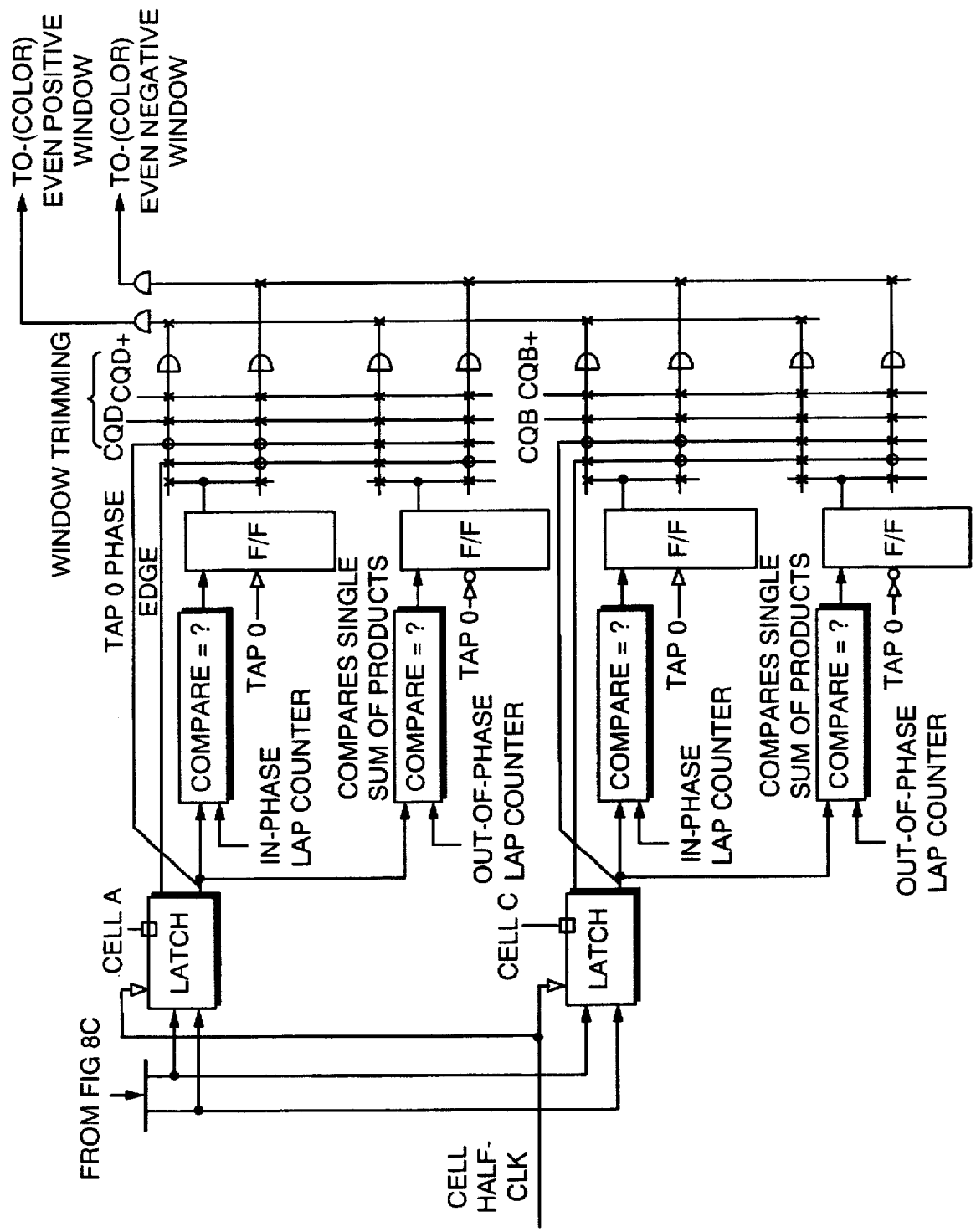
Figure 8E:
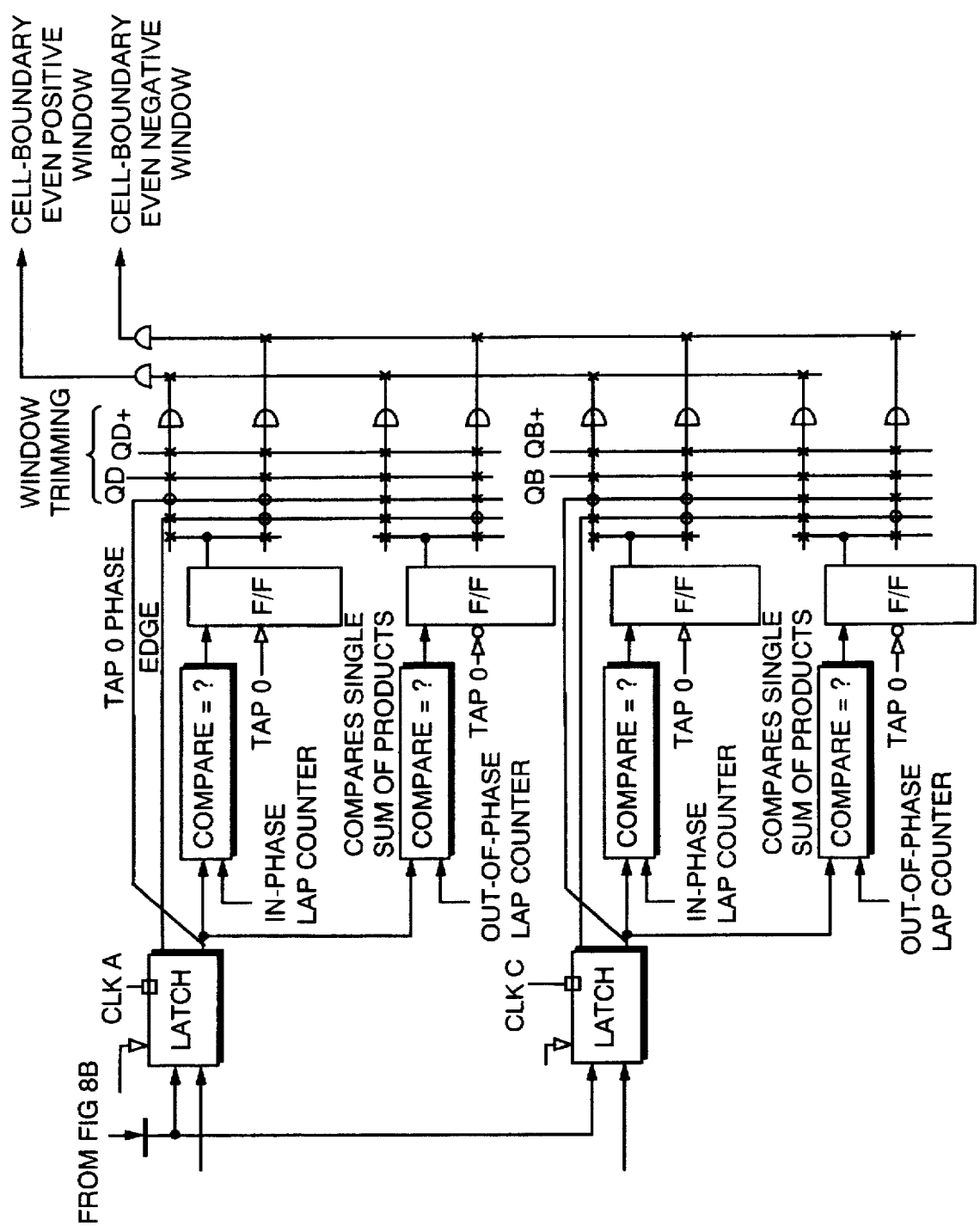

Flip flops 300 and 302, shown in more detail in FIG. 7, actually consists of one JK flip-flop 402 and one D flip-flop 400, called respectively the "video FF" and "shadow FF", plus the associated logic shown. Their function is to simulate a toggle FF while preventing certain types of errors that can occur with actual toggle FFs. Specifically, shadow FF 400 determines in advance, using logic that is not time-sensitive, the desired state of the video-flip at the end of the current cell. It then allows video FF 402 to toggle only in the desired direction and, furthermore, forces it to the desired state at the end of the cell if it fails to toggle. The remainder of the logic shown in FIG. 7 will be understandable to those skilled in the art.

Each of the twelve toggle FF circuits (e.g. 300, 302, FIG. 6) has associated with it a specific "window" signal generated as shown in FIG. 8. The function of the window signal is to bracket or mask for the desired edge coming out of the corresponding multiplexor. The selected tap signal coming out of the multiplexor is a square wave (which changes phase when the multiplexor switches to another tap). Only one edge, either positive or negative-going, of that square wave is used to actually toggle the video FF, and thereby propagate through to the output video. Six of the twelve video FF's are positive-edge triggered and six are negative-edge triggered. A video FF that has the "wrong" polarity, (i.e. is not to be used for a transition in the current cell), has a zero window. Its J and K inputs remain zero and it is blind to whatever signal is on its trigger input. A video FF with the "right" polarity, as determined by the "mid-bit" calculated by the transition algebra section, gets a window which brackets the desired edge and appears on the J or K input (as selected by the shadow FF) of the video FF.

The duration of the window signal is one cycle of the loop-oscillator, which is twice the total propagation time through the loop. Windows can only occur at discrete times which are coarsely spaced by one-half loop-oscillator period. A window can either start on a positive-going transition in the Tap zero signal and end on the next positive-going transition in the tap zero signal, or it can start and end on successive negative-going transitions in the tap zero signal, delayed by propagation delays. Which tap zero transition starts the window is calculated several cells in advance by the transition algebra section. The comparators shown in FIG. 8 (e.g. comparators 404 (in phase) and 406 (out of phase)) make the final determination, comparing the current lap counts with calculated lap counts. Combinatorial logic forms the actual windows, with some windows at the ends of cells receiving "window trimming" to mask out switching transients on the video FF trigger signals. A hard-wired digital fudge-factor T, shown as "-6" in FIG. 8, biases the selection of which tap zero transition is to start the window. It compensates for propagation delays, setup and hold times, and signal skew and has a wide latitude in a properly laid-out chip. T is determined during chip simulation, and may be zero or negative.

Both the windows-formation circuit and the multiplexor-drive circuit, FIG. 6 and 8, must pass transition-algebra data from pixel-clock timed pipelining to cell-timed pipelining, which can have an arbitrary relationship to each other in a given scan line. The polarity of the cell half-clk signal in a given scan line is carefully selected (by its shadow FF logic) to insure that this data-passoff is within setup/hold margins.

Figure 9A:
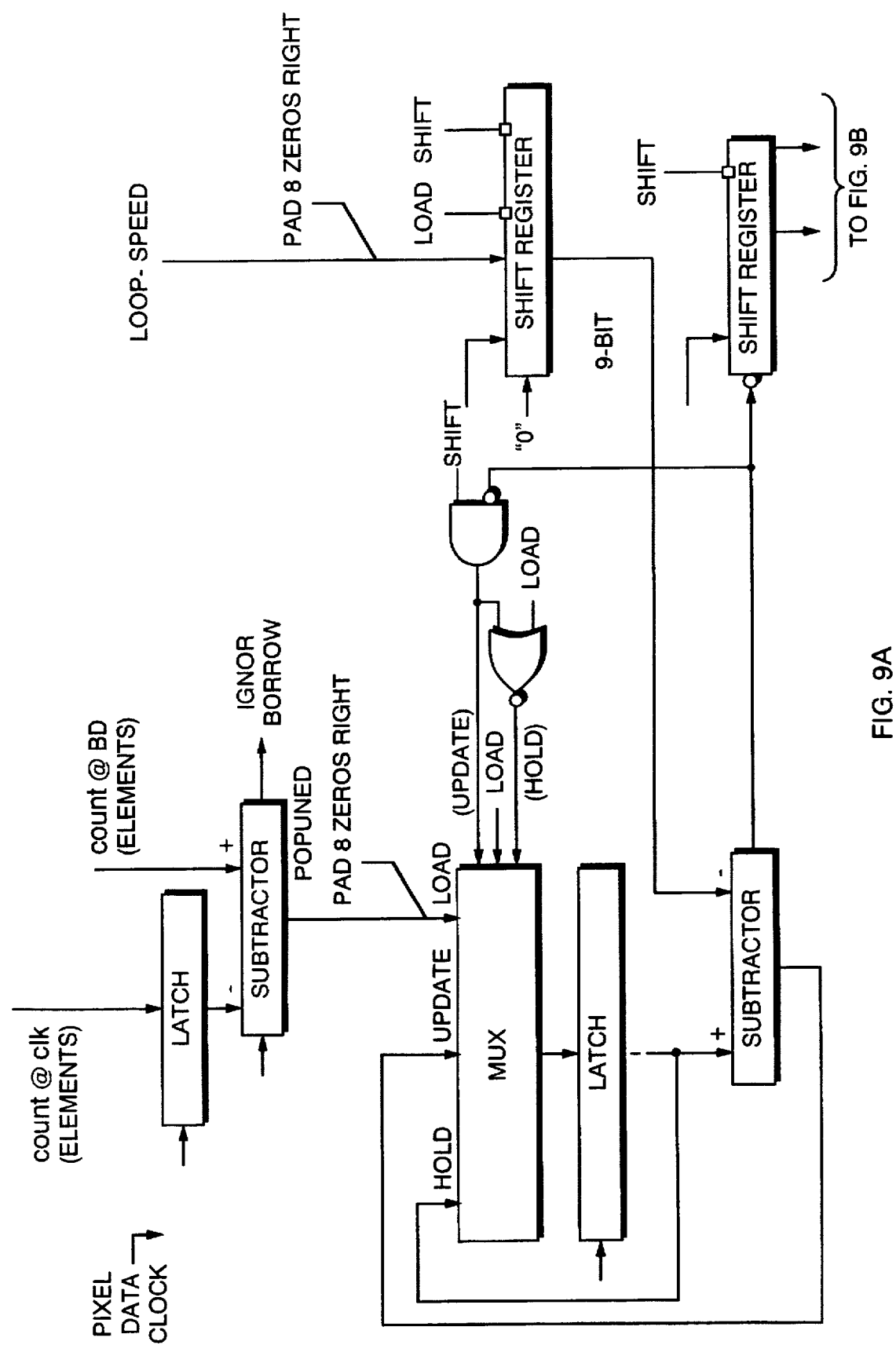
FIG. 9 is a more detailed block diagram of the horizontal synchronization circuitry shown in the modulator of FIG. 5.
Figure 9B:
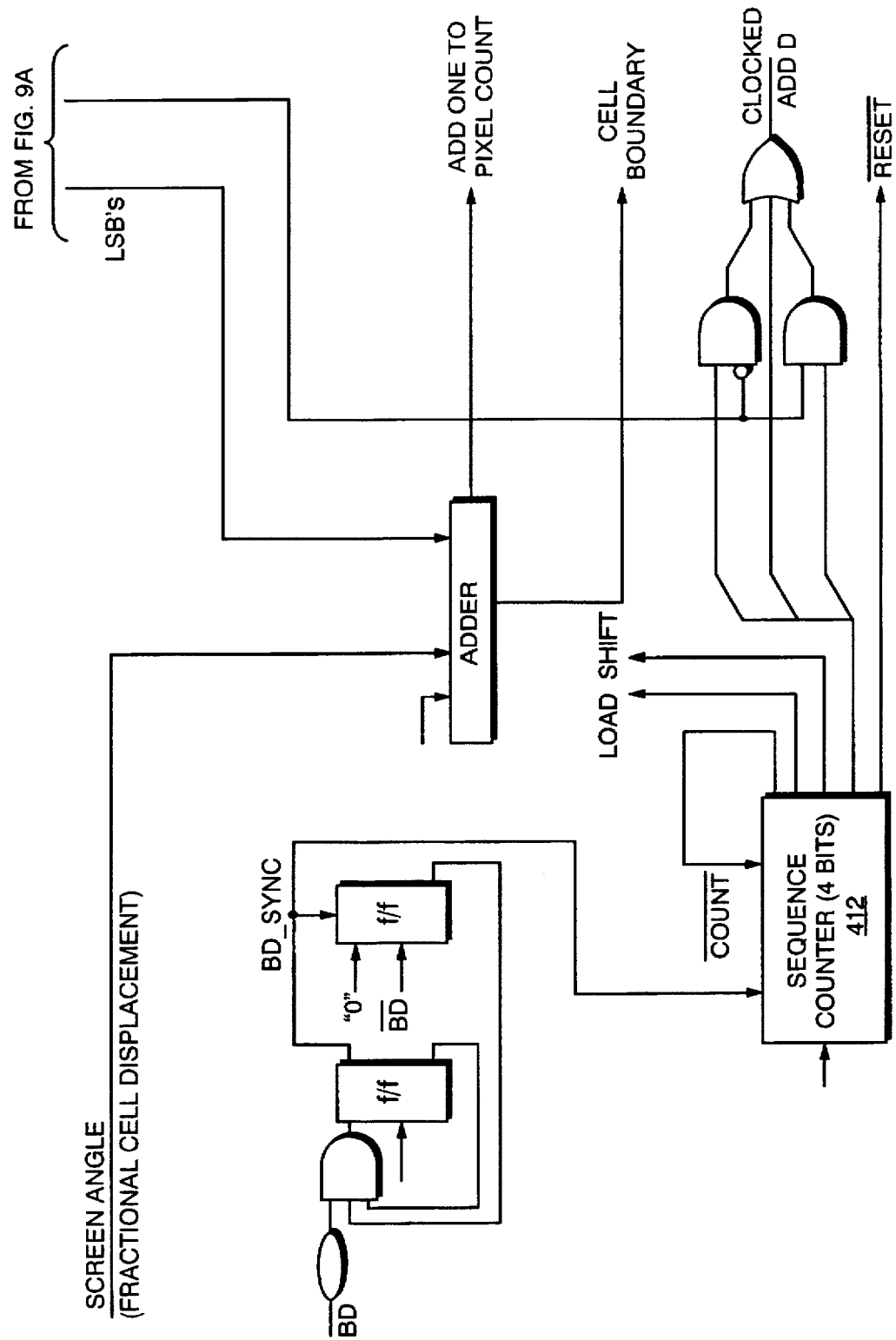

The function of the horizontal synchronization circuit 316, FIG. 5 shown in more detail in FIG. 9 is to measure the position of the BD signal within a pixel-clock period. The transition-algebra circuitry 206 then uses this information to locate cells within the scan line to exactly line up vertically with cells in the previous line. Circuit 316 must also synchronize the incoming data from line to line by giving a "clocked BD" signal to the circuitry ahead of the modulator, telling it to begin the current line of data. The horizontal synchronization calculation requires careful attention to detail because the BD signal can occur at any time and therefore setup/hold violations are inevitable. Trace 410, FIG. 10 shown in exaggerated fashion, indicates the BD times where exact circuit performance is unpredictable but of the logic shown in the circuit subsequently cancels this unpredictability.

The actual 8-bit number "cell boundary" calculated by the horizontal synchronization circuit is a fraction between 0 and 1 representing the position of BD within a pixel-clock period. A zero cell boundary represents BD falling right at a pixel-clock edge, save for propagation delays (which cancel-out line-to-line). The computation of "cell boundary" involves dividing the number of tap delays between BD and the nearest previous clock edge by the loop speed (in tap delays per clock cycle). Since that division need be performed only once per line, a minimal subtract-and-shift divider can be used. Sequence counter 412 orchestrates the activity of the horizontal synchronization circuit at the beginning of each line. Horizontal synchronization is static during a line unless the screen-angle input is utilized.

Free-running loop oscillator 22a, FIG. 5 is effectively a high precision uncalibrated clock consisting of two components: the lap count, giving the coarse time to within one lap, and the loop itself, giving the fine time within plus/minus one tap delay. The function of "convert-to-element" circuit, 312 and 314 shown in more detail in FIG. 11, is to take a snapshot of the loop and lap counters at a specified time and then convert that snapshot to a single binary number representing the current 'time' in units of tap-delays (also called elements). That single binary number is then easily used for calculations in the transition-algebra section or other calculations. In the printer-modulator circuit shown, one convert-to-element circuit takes snapshots at BD time and circuit 312 uses snapshots taken at each pixel clock edge. In a time-to-digital converter, the snapshots are triggered by external signals whose time is to be precisely determined.

The capture is done by D-flip-flops, ideally specially designed to minimize skew between positive and negative-going transitions. As previously discussed, two lap counts are maintained, 'in-phase' and 'out-of-phase', which, respectively, count on the positive and negative-gong edges of Tap zero, plus propagation delay. The captured state of Tap zero itself determines which lap counter is used. The unused one may have switching transients at the time of the capture. As shown in the timing diagrams of FIG. 11, the relationship between the actual counts of circuit 208, FIG. 5, is arranged to guarantee that the output of convert-to-element is an ordinary binary number that counts in the customary sequence of binary numbers.

The selected lap-counter count becomes the high bits of the final binary number, the ten high bits in the circuit shown. The next lower bit, called the 'mid-bit' is simply the captured Tap zero state. It comes about because the period of the loop oscillator is twice the total propagation through the loop. The loop is designed and reset, 201 FIG. 5, so that there is exactly one edge (change of state) in propagation through the loop at any given instant. The polarity of Tap zero, then, represents which polarity edge is propagating. The edge, a change-of-state in time, is not to be confused with the reversal of polarity from one tap to the next which will occur (as shown) if each delay element is inverting. Inverting delay elements are useful to cancel the differential propagation delay between transition polarities.

The low bits of the convert-to-element output binary number, the four low bits in the case of 16 taps, represent the number, e.g. 0–15, of that one delay element which is propagating the edge at the instant of the snapshot. The active delay element can be determined by comparing the two taps at either end of that element. If it is an inverting element, as 15 of the 16 elements shown are, and the snapshot captures the same polarity at both ends, the circuit knows the edge is propagating through that element. Likewise, if the edge is propagating though a non-inverting delay element, its ends will be opposite polarity. The net number of inversions in the loop must be odd for the loop to oscillate.

Thus, the location of the propagating edge is determined by exclusive-ORs (XOR) between adjacent taps, as shown in FIG. 11. The outputs of the XORs are then converted to a binary number by the combinatorial logic as shown.

Figure 12A:
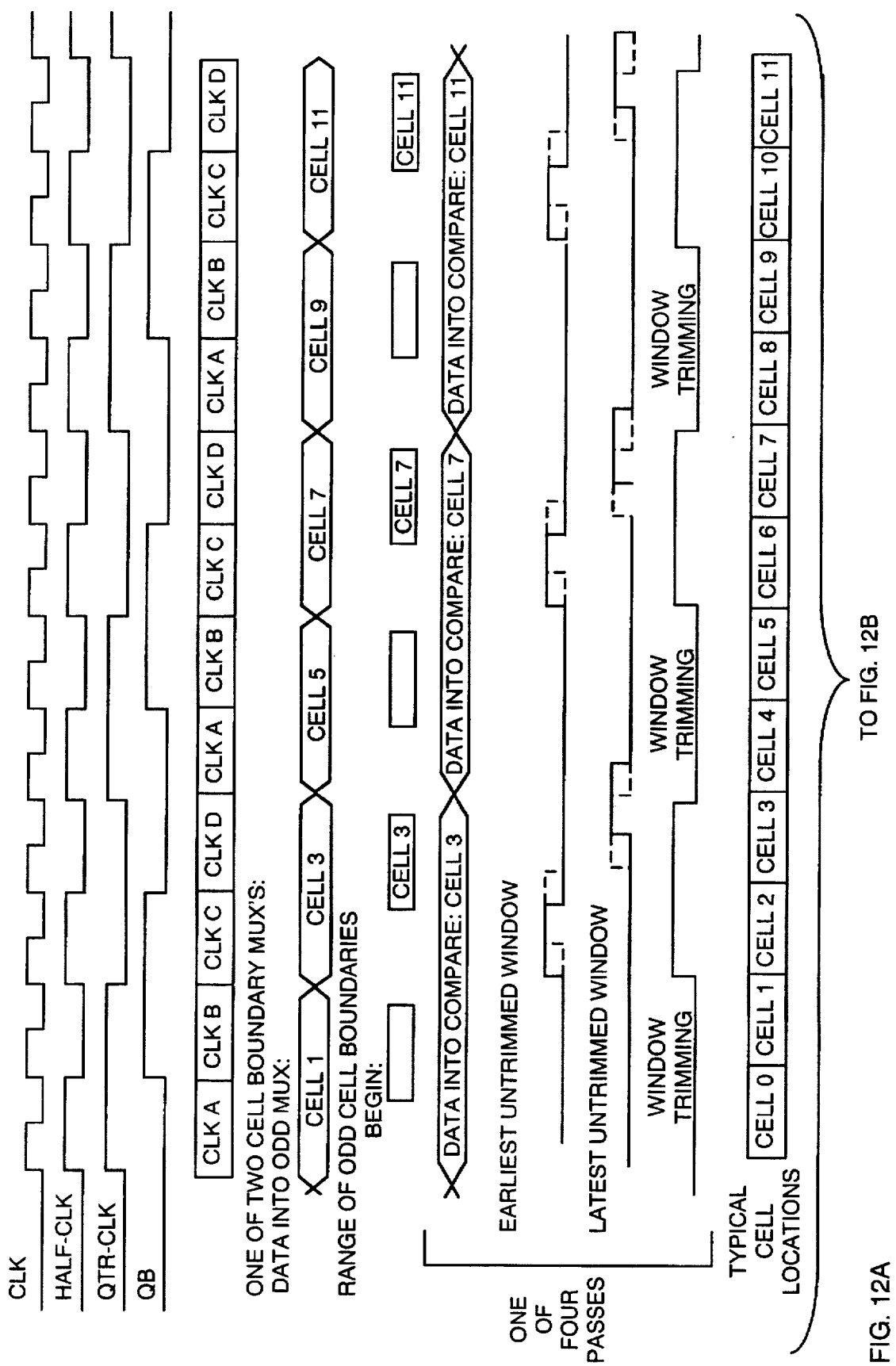
FIG. 12 is a master timing diagram for the modulator shown in FIG. 5.
Figure 12B:
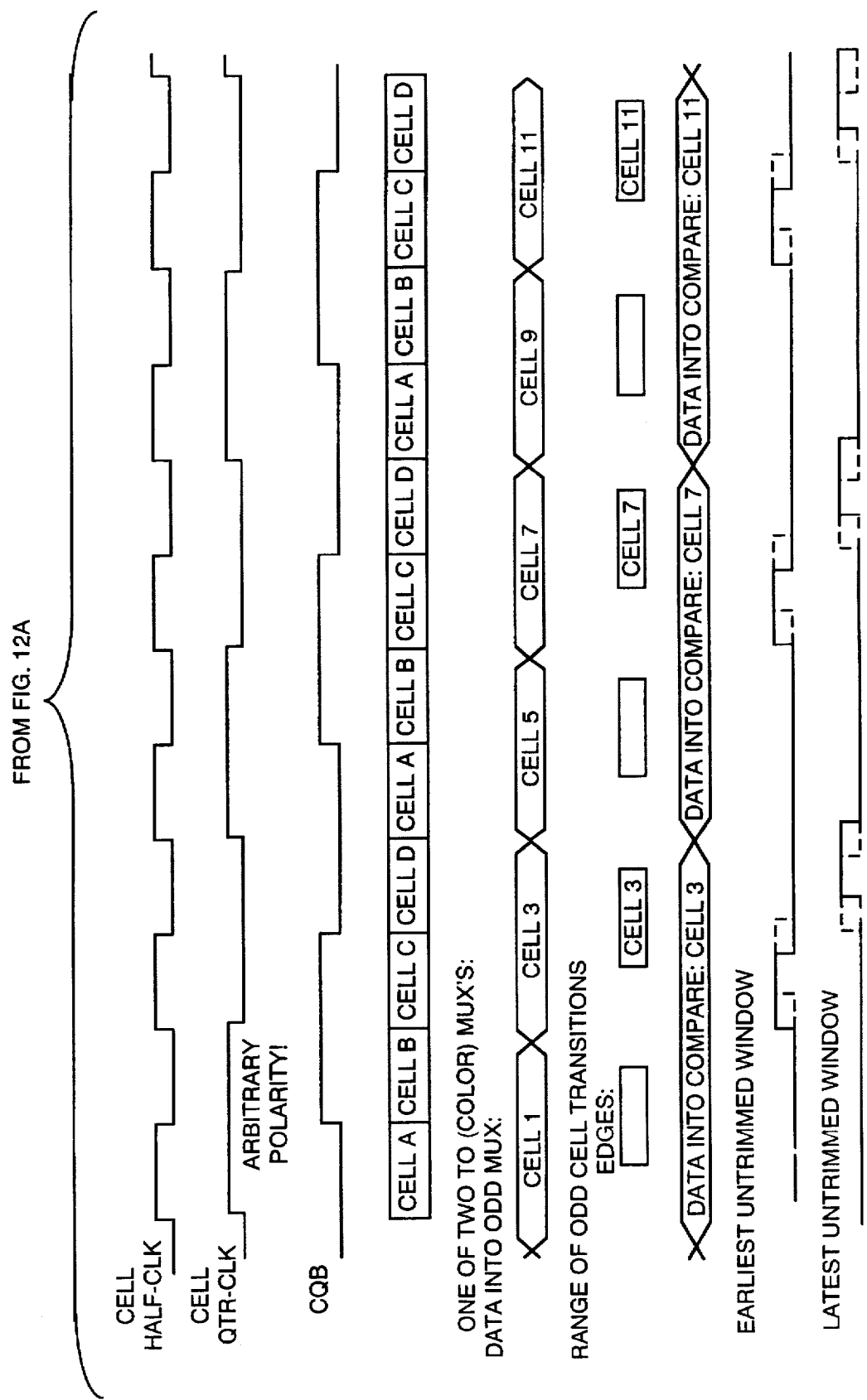

The delay between taps is small to obtain high precision and the time of the snapshot is arbitrary compared to what is going on in the loop. Therefore, setup and hold violations in the D flip-flops forming the snapshot latch are inevitable. This must be understood and allowed for in the simulation of the chip or the simulator will flag the circuit as failing when it is not. Slight differences among the D flip-flops and paths can cause "bounce", the edge appearing to be at three (or five, in extreme cases) nearby places in the loop. This is corrected by the logic labeled "debouncers" 414, FIG. 11. The debouncer logic 414 picks the first edge as the "real" one. A more sophisticated debouncer logic circuit, not shown, uses captured signals from the opposite side of the loop, which can be presumed to be unambiguous to further define the correct edge location. The master timing diagram, FIG. 12, illustrates the timing and sequencing of the CLK, half-CLK, qtr-CLK and other signals discussed above.

Although specific features of the invention are shown in some drawings and not others, this is for convenience only as some feature may be combined with any or all of the other features in accordance with the invention. For example, the free loop modulator described with reference to an interval timer and a video signal controller may be implemented within a frequency synthesizer, FM modulator, D/A converter or any other device which requires the availability of finely addressable signals.

Other embodiments will occur to those skilled in the art and are within the following claims:

What is claimed is:

1. A free loop modulator comprising:
   a set of successive delay means connected in series forming a free running loop oscillator;
   a set of successive taps disposed between the delay means, each tap providing a differently phased oscillator signal;
   means for defining a desired time of an signal transition;
   means for determining which tap signal contains a transition proximate the desired time; and
   means for selecting the tap signal which contains a transition proximate the desired time.

2. The free loop modulator of claim 1 further including means for propagating the selected tap signal transition to an output of the free loop modulator.

3. The free loop modulator of claim 1 in which each delay means comprises at least one inverter element.

4. The free loop modulator of claim 3 in which each said tap is located between a plurality of inverter elements.

5. The free loop modulator of claim 3 in which said set of successive delay means includes a first group of inverter elements connected in series, each of said first group of inverter elements providing a first delay time; and a second group of inverter elements connected in series, each of said second group of inverter elements providing a second delay time.

6. The free loop modulator of claim 5 in which said set of successive taps includes a first group of taps disposed between the inverter elements in the first group of inverter elements, and a second group of successive taps disposed between the inverter elements in the second group of inverter elements.

7. The modulator of claim 1 in which said means for determining a desired time of a transition includes means for receiving a first signal indicative of the location of a transition within a print cell.

8. The modulator of claim 7 in which said means for determining which tap signal contains a transition proximate the desired time includes:
   means, responsive to the first signal, for computing the tap containing a transition at the location represented in the first signal, and
   means for generating a second signal representing the computed tap.

9. The modulator of claim 8 in which said means for selecting includes a multiplexor having a plurality of gates each connected to a said tap and connected to said means for generating, for propagating the tap signal corresponding to the transition desired.

10. The modulator of claim 1 further including means for counting each lap of said oscillator and means for latching the state of each tap.

11. The modulator of claim 10 in which said means for latching includes two latches for separately latching the lap count on the positive and negative transitions of one selected tap.

12. The modulator of claim 10 in which said means for determining further includes means, responsive to the means for latching, for determining the speed of the oscillator.

13. The modulator of claim 12 in which said means for determining includes means, responsive to said means for latching, for computing a cell boundary position for the desired signal transition.

14. The modulator of claim 13 in which said means for determining further includes means, responsive to the cell boundary position, the speed of the oscillator, and the desired time of a signal transition, for computing both the tap and lap of the oscillator which provides said transition.

15. A free loop modulator comprising:
   a set of successive delay means connected in series forming a free running loop oscillator;

a set of successive taps disposed between the delay means, each tap providing a differently phased oscillator signal;

means for latching the state of each tap;

means for defining a desired time of a signal transition;

means for determining which tap signal contains a transition proximate the desired time;

means for selecting the tap signal which contains a transition proximate the desired time; and means, responsive to the means for latching, for determining the speed of the oscillator.

16. A free loop modulator comprising:

a set of successive delay means connected in series forming a free running loop oscillator;

a set of successive taps disposed between the delay means, each tap providing a differently phased oscillator signal;

means for counting each lap of said oscillator;

means for latching the state of each tap including two latches for separately latching the lap count on the positive and negative transitions of one selected tap;

means for defining a desired time of a signal transition;

means for determining which tap signal contains a transition proximate the desired time; and means for selecting the tap signal which contains a transition proximate the desired time.

* * * * *